(12) United States Patent
Kawai et al.

(10) Patent No.: US 12,446,250 B2
(45) Date of Patent: Oct. 14, 2025

(54) NORMALLY-OFF MODE POLARIZATION SUPER JUNCTION GaN-BASED FIELD EFFECT TRANSISTOR AND ELECTRICAL EQUIPMENT

(71) Applicant: POWDEC K.K., Oyama (JP)

(72) Inventors: Hiroji Kawai, Oyama (JP); Shuichi Yagi, Oyama (JP); Hironobu Narui, Oyama (JP)

(73) Assignee: POWDEC K.K., Oyama (JP)

( * ) Notice: Subject to any disclaimer, the term of this patent is extended or adjusted under 35 U.S.C. 154(b) by 535 days.

(21) Appl. No.: 17/921,225

(22) PCT Filed: Sep. 16, 2021

(86) PCT No.: PCT/JP2021/034029
§ 371 (c)(1),
(2) Date: Oct. 25, 2022

(87) PCT Pub. No.: WO2022/190414
PCT Pub. Date: Sep. 15, 2022

(65) Prior Publication Data
US 2023/0170407 A1 Jun. 1, 2023

(30) Foreign Application Priority Data

Mar. 11, 2021 (JP) ................................ 2021-038916
Sep. 3, 2021 (JP) ................................ 2021-143739

(51) Int. Cl.
*H10D 30/47* (2025.01)
*H10D 8/00* (2025.01)
(Continued)

(52) U.S. Cl.
CPC ......... *H10D 30/4732* (2025.01); *H10D 8/422* (2025.01); *H10D 30/015* (2025.01);
(Continued)

(58) Field of Classification Search
None
See application file for complete search history.

(56) References Cited

U.S. PATENT DOCUMENTS

2014/0209922 A1* 7/2014 Ota .................... H10D 64/111
257/194
2016/0093691 A1 3/2016 Echigoya et al.
(Continued)

FOREIGN PATENT DOCUMENTS

JP H11261053 A 9/1999
JP 2008091394 A 4/2008
(Continued)

OTHER PUBLICATIONS

International Search Report from corresponding PCT application PCT/JP2021/034029, dated Nov. 22, 2021.
(Continued)

*Primary Examiner* — Xiaoming Liu
(74) *Attorney, Agent, or Firm* — K&L Gates LLP

(57) ABSTRACT

This normally-off mode polarization super junction GaN-based FET has an undoped GaN layer 11, an $Al_xGa_{1-x}N$ layer 12, an island-like undoped GaN layer 13, a p-type GaN layer 14 and a p-type $In_yGa_{1-y}N$ layer 15 which are stacked in order. The FET has a gate electrode 16 on the uppermost layer, a source electrode 17 and a drain electrode 17 on the $Al_xGa_{1-x}N$ layer 12 and a p-type $In_zGa_{1-z}N$ layer 19 and a gate electrode 20 which are located beside one end of the undoped GaN layer 13 on the $Al_xGa_{1-x}N$ layer 12. The gate electrode 20 may be provided on the p-type $In_zGa_{1-z}N$ layer 19 via a gate insulating film. At a non-operating time, $n_0 \le n_1 < n_2 < n_3$ is satisfied for the concentration $n_0$ of the 2DEG 22 formed in the undoped GaN layer 11/the $Al_xGa_{1-x}N$ layer 12 hetero-interface just below the gate electrode 20, the concentration $n_1$ of the 2DEG 22 just below the gate electrode 16, the concentration $n_2$ of the 2DEG 22 in the
(Continued)

polarization super junction region and the concentration $n_3$ of the 2DEG 22 in the part between the polarization super junction region and the drain electrode 18.

9 Claims, 15 Drawing Sheets

(51) Int. Cl.
  *H10D 30/01* (2025.01)
  *H10D 62/10* (2025.01)
  *H10D 62/824* (2025.01)
  *H10D 62/85* (2025.01)
  *H10D 64/27* (2025.01)

(52) U.S. Cl.
  CPC ......... *H10D 62/124* (2025.01); *H10D 64/411* (2025.01); *H10D 64/512* (2025.01); *H10D 62/824* (2025.01); *H10D 62/8503* (2025.01)

(56) References Cited

U.S. PATENT DOCUMENTS

| 2017/0263710 | A1* | 9/2017 | Matsumoto | H10D 62/824 |
| 2019/0123187 | A1 | 4/2019 | Tarumi et al. | |
| 2022/0238728 | A1* | 7/2022 | Kawai | H10D 64/117 |
| 2023/0352573 | A1* | 11/2023 | Sato | H10D 62/8503 |

FOREIGN PATENT DOCUMENTS

| JP | 2011109131 A | 6/2011 |
| JP | 5669119 B1 | 2/2015 |
| JP | 2015207610 A | 11/2015 |
| JP | 5828435 B1 | 12/2015 |
| JP | 2017212425 A | 11/2017 |
| JP | 6679036 B1 | 4/2020 |

OTHER PUBLICATIONS

Mizutani et al.; "AlGaN/GaN HEMTs With Thin InGaN Cap Layer for Normally Off Operation"; IEEE Electron Device Letters, vol. 28, No. 7, Jul. 2007, pp. 549-551. (3 pages.).

Li et al.; "Normally-off mode AlGaN/GaN HEMTs with p-InGaN Cap Layer"; The Institute of Electronics, Information and Communication Engineers Technical Report; 2008. (5 pages.).

Office action issued in corresponding Japanese Patent Application No. 2021-143739, dated Mar. 25, 2022. (2 pages.).

Office action issued in corresponding Japanese Patent Application No. 2021-038916, dated Jun. 11, 2021. (5 pages.).

\* cited by examiner

NORMALLY-OFF MODE POLARIZATION SUPER JUNCTION GaN-BASED FIELD EFFECT TRANSISTOR AND ELECTRICAL EQUIPMENT

TECHNICAL FIELD

The present invention relates to a normally-off mode polarization super junction GaN (gallium nitride)-based field effect transistor and electrical equipment using the normally-off mode polarization super junction GaN-based field effect transistor.

BACKGROUND ART

Conventionally, polarization super junction (PSJ) GaN-based field effect transistors (FETs) are known as power transistors (see patent literatures 1, 2). The polarization super junction GaN-based field effect transistor has a polarization super junction region including a structure in which an undoped GaN layer, an $Al_xGa_{1-x}N$ layer and an undoped GaN layer are stacked in order. The polarization super junction GaN-based field effect transistor can realize high voltage resistance, high output, high efficiency and high speed operation, which are difficult to realize by silicon (Si)-based power transistors.

In AlGaN/GaN HEMT (High Electron Mobility Transistor), it is known to realize a normally-off mode by forming an undoped InGaN layer or a p-type InGaN layer on an AlGaN layer and forming a gate electrode thereon (see non-patent literatures 1, 2). A diode configured by a double gate polarization super junction GaN-based field effect transistor is also known (see patent literature 3).

PRIOR ART LITERATURE

Patent Literature

[PATENT LITERATURE 1] Gazette of U.S. Pat. No. 5,828,435
[PATENT LITERATURE 2] Gazette of U.S. Pat. No. 5,669,119
[PATENT LITERATURE 3] Gazette of U.S. Pat. No. 6,679,036

Non-Patent Literature

[NON-PATENT LITERATURE 1] Mizutani et al., "AlGaN/GaN HEMTs with thin InGaN cap layer for normally-off operation", IEEE Electron Device Letters, Vol. 28, No. 7, p. 549, July (2007)
[NON-PATENT LITERATURE 2] Xu L I et al., "Normally-off mode AlGaN/GaN HEMTs using a p-InGaN cap layer", IEICE technical report, 2008

SUMMARY OF INVENTION

Subjects to be Solved by Invention

The polarization super junction GaN-based field effect transistors described in patent literatures 1, 2 are mainly the so-called normally-on mode transistors in which current flows between the source electrode and the drain electrode when a voltage is applied between the source electrode and the drain electrode in a state of gate voltage $V_g=0$ V or an open state because two-dimensional electron gas (2DEG) exists in the undoped GaN layer in the vicinity part of a hetero-interface between the lower undoped GaN layer and the $Al_xGa_{1-x}N$ layer.

On the other hand, in many cases, transistors are requested the so-called fail safe operation in which the transistor is in off state when the control signal (gate signal) is lost. Regarding the normally-on mode polarization super junction GaN-based field effect transistors described in patent literatures 1, 2, it is possible to realize normally-off mode by making a cascode circuit or modified cascode circuit using low voltage resistance normally-off mode Si MOS transistors. However, it is disadvantageous because it invites complication of the circuit.

Therefore, the subject to be solved by the invention is to provide a normally-off mode polarization super junction GaN-based field effect transistor which can easily realize a normally-off mode transistor without using complicated circuits and a high performance electrical equipment using the normally-off mode polarization super junction GaN-based field effect transistor.

Means to Solve the Subjects

In order to solve the subject, according to the invention, there is provided a normally-off mode polarization super junction GaN-based field effect transistor, comprising:
a first undoped GaN layer,
an $Al_xGa_{1-x}N$ layer ($0<x<1$) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer ($0<y<1$) on the p-type GaN layer,
a source electrode on the $Al_xGa_{1-x}N$ layer,
a drain electrode on the $Al_xGa_{1-x}N$ layer,
a first gate electrode electrically connected to the p-type $In_yGa_{1-y}N$ layer; and
a p-type $In_zGa_{1-z}N$ layer ($0<z<1$) and a second gate electrode thereon on the $Al_xGa_{1-x}N$ layer which are located beside one end of the second undoped GaN layer on the side of the source electrode,
the p-type GaN layer existing on the whole surface of the second undoped GaN layer or on only one side of the surface of the second undoped GaN layer on the side of the source electrode,
the p-type $In_yGa_{1-y}N$ layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode,
$n_0 \leq n_1 < n_2 < n_3$
being satisfied at a non-operating time if the concentration of a two-dimensional electron gas formed in the first undoped GaN layer in the vicinity part of a hetero-interface between the first undoped GaN layer and the $Al_xGa_{1-x}N$ layer just below the second gate electrode is denoted as $n_0$, the concentration of the two-dimensional electron gas just below the first gate electrode is denoted as $n_1$, the concentration of the two-dimensional electron gas in a polarization super junction region is denoted as $n_2$ and the concentration of the two-dimensional electron gas in a part between the polarization super junction region and the drain electrode is denoted as $n_3$.

In the normally-off mode polarization super junction GaN-based field effect transistor, if the p-type GaN layer exists on the whole surface of the second undoped GaN layer, the polarization super junction region comprises the first undoped GaN layer, the $Al_xGa_{1-x}N$ layer, the second undoped GaN layer and the p-type GaN layer except the part of the gate electrode contact region. If the p-type GaN layer exists on only one side of the surface of the second undoped GaN layer on the side of the source electrode, the polarization super junction region comprises the first undoped GaN layer, the $Al_xGa_{1-x}N$ layer and the second undoped GaN layer on which the p-type GaN layer does not exist. If the polarization super junction region comprises the first undoped GaN layer, the $Al_xGa_{1-x}N$ layer, the second undoped GaN layer and the p-type GaN layer as in the former, the thickness of the first undoped GaN layer, the thickness and the Al composition x of the $Al_xGa_{1-x}N$ layer, the thickness of the second undoped GaN layer and the thickness and the impurity concentration of the p-type GaN layer are typically selected based on patent literature 2. If the polarization super junction region comprises the first undoped GaN layer, the $Al_xGa_{1-x}N$ layer and the second undoped GaN layer as in the latter, the thickness of the first undoped GaN layer, the thickness and the Al composition x of the $Al_xGa_{1-x}N$ layer and the thickness of the second undoped GaN layer are typically selected based on patent literature 1.

In the normally-off mode polarization super junction GaN-based field effect transistor, typically, if the concentration of a two-dimensional hole gas formed in the second undoped GaN layer in the vicinity part of a hetero-interface between the second undoped GaN layer and the $Al_xGa_{1-x}N$ layer just below the first gate electrode is denoted as $p_1$ and the concentration of the two-dimensional hole gas in the polarization super junction region is denoted as $p_2$, $p_1 > p_2$ is satisfied at a non-operating time.

The $Al_xGa_{1-x}N$ layer is typically undoped, but may be an n-type or a p-type $Al_xGa_{1-x}N$ layer doped with donors (n-type impurities) or acceptors (p-type impurities). The $Al_xGa_{1-x}N$ layer is typically undoped. As necessary, an $Al_uGa_{1-u}N$ layer ($0<u \leq 1$, $u>x$), typically undoped, for example an AlN layer may be provided between the first undoped GaN layer and the $Al_xGa_{1-x}N$ layer and/or between the second undoped GaN layer and the $Al_xGa_{1-x}N$ layer. By providing the $Al_uGa_{1-u}N$ layer between the second undoped GaN layer and the $Al_xGa_{1-x}N$ layer, permeation of the two-dimensional hole gas formed in the second undoped GaN layer in the vicinity part of the hetero-interface between the second undoped GaN layer and the $Al_xGa_{1-x}N$ layer into the $Al_xGa_{1-x}N$ layer can be reduced, and mobility of holes can be increased dramatically. Also, by providing the $Al_uGa_{1-x}N$ layer between the first undoped GaN layer and the $Al_xGa_{1-x}N$ layer, permeation of the two-dimensional electron gas formed in the first undoped GaN layer in the vicinity part of the hetero-interface between the first undoped GaN layer and the $Al_xGa_{1-x}N$ layer into the $Al_xGa_{1-x}N$ layer can be reduced, and mobility of electrons can be increased dramatically. The $Al_uGa_{1-u}N$ layer may be generally sufficiently thin, for example, about 0.5~2 nm.

Typically, the drain current when the gate voltage of the second gate electrode is 0 [V] and the drain voltage is 1.0 [V] is not larger than 1/100 of the drain current when the gate voltage of the second gate electrode is 5 [V] (rated current).

In the normally-off mode polarization super junction GaN-based field effect transistor, the second gate electrode may be provided on the p-type $In_zGa_{1-z}N$ layer via a gate insulating film. In this case, the second gate electrode, the gate insulating film and the p-type $In_zGa_{1-z}N$ layer forms a MIS (Metal Insulator Semiconductor) structure.

Each terminal of the normally-off mode polarization super junction GaN-based field effect transistor can be connected according to uses. For example, if the first gate electrode and the second gate electrode are electrically connected each other, the first gate electrode and the second gate electrode can act as one gate electrode. If the first gate electrode and the source electrode are electrically connected each other, the first gate electrode can act as a field plate. The first gate electrode may be fixed to a positive potential with respect to the potential of the source electrode. If the first gate electrode, the second gate electrode and the source electrode are electrically connected each other, the normally-off mode polarization super junction GaN-based field effect transistor can operate as a diode.

The p-type $In_yGa_{1-y}N$ layer and the p-type $In_zGa_{1-z}N$ layer may be formed by any method basically. It is possible to form them easily by sputtering methods.

Furthermore, according to the invention, there is provided electrical equipment, comprising:
at least a transistor,
the transistor being
a normally-off mode polarization super junction GaN-based field effect transistor, comprising:
a first undoped GaN layer,
an $Al_xGa_{1-x}N$ layer ($0<x<1$) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer ($0<y<1$) on the p-type GaN layer,
a source electrode on the $Al_xGa_{1-x}N$ layer,
a drain electrode on the $Al_xGa_{1-x}N$ layer,
a first gate electrode electrically connected to the p-type $In_yGa_{1-y}N$ layer; and
a p-type $In_zGa_{1-z}N$ layer ($0<z<1$) and a second gate electrode thereon on the $Al_xGa_{1-x}N$ layer which are located beside one end of the second undoped GaN layer on the side of the source electrode,
the p-type GaN layer existing on the whole surface of the second undoped GaN layer or on only one side of the surface of the second undoped GaN layer on the side of the source electrode,
the p-type $In_yGa_{1-y}N$ layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode, $n_0 \leq n_1 < n_2 < n_3$ being satisfied at a non-operating time if the concentration of a two-dimensional electron gas formed in the first undoped GaN layer in the vicinity part of a hetero-interface between the first undoped GaN layer and the $Al_xGa_{1-x}N$ layer just below the second gate electrode is denoted as $n_0$, the concentration of the two-dimensional electron gas just below the first gate electrode is denoted as $n_1$, the concentration of the two-dimensional electron gas in a polarization super junction region is denoted as $n_2$ and the concentration of the two-dimensional electron gas in a part between the polarization super junction region and the drain electrode is denoted as $n_3$.

Here, the electrical equipment includes all equipment using electricity and their uses, functions, sizes and the like are not limited. They are, for example, electronic equipment, mobile bodies, power plants, construction machinery, machine tools and the like. The electronic equipment are, for example, robots, computers, game equipment, car equipment, home electric products (air conditioners and the like), industrial products, mobile phones, mobile equipment, IT equipment (servers and the like), power conditioners used in solar power generation systems, power supplying systems and the like. The mobile bodies are railroad cars, motor vehicles (electric cars and the like), motorcycles, aircrafts, rockets, spaceships and the like.

In the invention of the electrical equipment, other than the above, the explanation concerning the above invention of the normally-off mode polarization super junction GaN-based field effect transistor comes into effect unless it is contrary to its character.

Effect of the Invention

According to the invention, it is possible to easily realize a normally-off mode polarization super junction GaN-based field effect transistor without using complicated circuits because the two-dimensional electron gas does not exist substantially just below the second gate electrode at a non-operating time (in thermal equilibrium) and it is possible to realize high performance electrical equipment using the normally-off mode polarization super junction GaN-based field effect transistor.

MODES FOR CARRYING OUT THE INVENTION

Modes for carrying out the invention (hereinafter referred as embodiments) will now be explained below.

The First Embodiment

[The Normally-Off Mode Polarization Super Junction GaN-Based FET]

Figure 1:
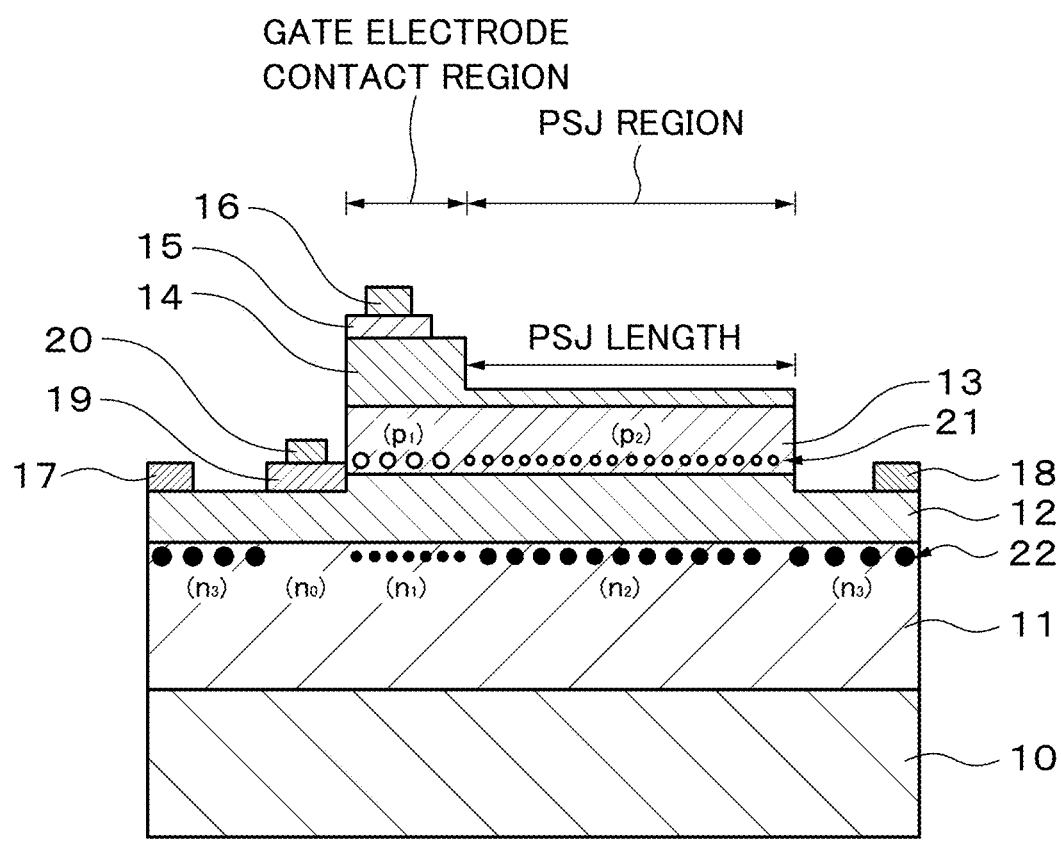
FIG. 1 A cross-sectional view showing a normally-off mode polarization super junction GaN-based FET according to a first embodiment of the invention.

As shown in FIG. 1, in the normally-off mode polarization super junction GaN-based FET according to the first embodiment, an undoped GaN layer 11, an $Al_xGa_{1-x}N$ layer 12 and an undoped GaN layer 13 are stacked in order on a substrate 10 via a buffer layer (not illustrated). The substrate 10 is preferably a substrate on which GaN-based semiconductor grows in C-plane orientation such as, for example, a C-plane sapphire substrate, a Si substrate, a SiC substrate and the like. The buffer layer is made of, for example, polycrystalline or amorphous GaN, AlN, AlGaN, further AlGaN/GaN superlattice and the like. The $Al_xGa_{1-x}N$ layer 12 is typically undoped, but may be n-type or p-type $Al_xGa_{1-x}N$ layer doped with donors (n-type impurities) or acceptors (p-type impurities). The undoped GaN layer 13 has an island-like shape. The $Al_xGa_{1-x}N$ layer 12 is exposed around the undoped GaN layer 13. In FIG. 1, shown is a case where the upper part of the $Al_xGa_{1-x}N$ layer 12 has the same island-like shape as the undoped GaN layer 13 and the thickness of the $Al_xGa_{1-x}N$ layer 12 other than this is smaller than the thickness of the island-like part of the $Al_xGa_{1-x}N$ layer 12. However, there may be a case where the upper part of the $Al_xGa_{1-x}N$ layer 12 has not an island-like shape and the thickness of the $Al_xGa_{1-x}N$ layer 12 is uniform. A p-type GaN layer 14 is stacked on the whole surface of the undoped GaN layer 13. The thickness of a part of the p-type GaN layer 14 on the side of a drain electrode 18 which will be described later is smaller than the thickness of a part of the p-type GaN layer 14 on the side of a source electrode 17 which will be described later. The part of the p-type GaN layer 14 having the smaller thickness corresponds to the polarization super junction region (PSJ region). A p-type $In_yGa_{1-y}N$ layer 15 is stacked on the part of the p-type GaN layer 14 having the larger thickness. Although the p-type $In_yGa_{1-y}N$ layer 15 may be stacked on the whole surface of the part of the p-type GaN layer 14 having the larger thickness, illustrated here is a case where the p-type $In_yGa_{1-y}N$ layer 15 is formed on only the part of the p-type GaN layer 14 having the larger thickness except a part on the side of the drain electrode 18. The p-type GaN layer 14 is doped with magnesium (Mg) as p-type impurities. The p-type $In_yGa_{1-y}N$ layer 15 is also doped with Mg. The In composition y of the p-type $In_yGa_{1-y}N$ layer 15 is $0<y<1$. More specifically, the In composition y and the thickness t of the p-type $In_yGa_{1-y}N$ layer 15 are selected as necessary and the In composition y is typically selected to be not larger than 0.20. The In composition y and the thickness t are typically selected to satisfy $y \times t \le 0.20 \times 5$ [nm] generally. For example, if $y=0.10$, t is selected to be about $t=10$ nm or smaller than this.

A gate electrode 16 is provided on the p-type $In_yGa_{1-y}N$ layer 15. The gate electrode 16 is made of metals having large work function, for example, typically nickel (Ni) so as to bring it ohmic contact with the p-type $In_yGa_{1-y}N$ layer 15. The gate electrode 16 may be made of a layered film made of a Ni film and another metal film stacked thereon. The source electrode 17 is provided on the $Al_xGa_{1-x}N$ layer 12 at a part on the side of the p-type $In_yGa_{1-y}N$ layer 15 with respect to the island-like layered structure made of the undoped GaN layer 13, the p-type GaN layer 14 and the p-type $In_yGa_{1-y}N$ layer 15 and the drain electrode 18 is provided on the $Al_xGa_{1-x}N$ layer 12 at a part on the opposite side with respect to the island-like layered structure. The source electrode 17 and the drain electrode 17 are made of metals having small work function, typically, for example titanium (Ti) so as to allow ohmic contact with the 2DEG formed in the undoped GaN layer 11 in the vicinity part of the hetero-interface between the undoped GaN layer 11 and the $Al_xGa_{1-x}N$ layer 12 as described later. The source electrode 17 and the drain electrode 18 may be made of a layered film made of a Ti film and aluminum (Al) film, nickel (Ni) film, gold (Au) film and the like stacked thereon. A p-type $In_zGa_{1-z}N$ layer 19 and a gate electrode 20 thereon are provided on the $Al_xGa_{1-x}N$ layer 12 beside one end of the island-like upper part of the $Al_xGa_{1-x}N$ layer 12 and the undoped GaN layer 13 on the side of the source electrode 17. The In composition z of the p-type $In_zGa_{1-z}N$ layer 19 may be the same as or different from the In composition y of the p-type $In_yGa_{1-y}N$ layer 15. The In composition z of the p-type $In_zGa_{1-z}N$ layer 19 is $0<z<1$. More specifically, the In composition z and the thickness t of the p-type $In_zGa_{1-z}N$ layer 19 are selected as necessary and the In composition z is typically selected to be not larger than 0.20. The In composition z and the thickness t are typically selected to satisfy $z \times t \le 0.20 \times 5$ [nm] generally. For example, if $z=0.10$, t is selected to be about $t=10$ nm or smaller than this.

In the normally-off mode polarization super junction GaN-based FET, a part of the p-type GaN layer 14 having the smaller thickness and the undoped GaN layer 13, the $Al_xGa_{1-x}N$ layer 12 and the undoped GaN layer 11 which are just below the part form the polarization super junction region (intrinsic polarization super junction region). The p-type $In_yGa_{1-y}N$ layer 15, a part of the p-type GaN layer 14 having the larger thickness and the undoped GaN layer 13, the $Al_xGa_{1-x}N$ layer 12 and the undoped GaN layer 11 which are just below the p-type GaN layer 14 form a gate electrode contact region.

In the normally-off mode polarization super junction GaN-based FET, due to piezo polarization and spontaneous polarization, positive fixed charge is induced in the $Al_xGa_{1-x}N$ layer 12 in the vicinity part of the hetero-interface between the undoped GaN layer 11 and the $Al_xGa_{1-x}N$ layer 12, and negative fixed charge is induced in the $Al_xGa_{1-x}N$ layer 12 in the vicinity part of the hetero-interface between the $Al_xGa_{1-x}N$ layer 12 and the undoped GaN layer 13. As a result, in the normally-off mode polarization super junction GaN-based FET, at a non-operating time (thermal equilibrium state), a 2DHG 21 is formed in the undoped GaN layer 13 in the vicinity part of the hetero-interface between the $Al_xGa_{1-x}N$ layer 12 and the undoped GaN layer 13 and a 2DEG 22 is formed in the undoped GaN layer 11 in the vicinity part of the hetero-interface between the undoped GaN layer 11 and the $Al_xGa_{1-x}N$ layer 12.

In the normally-off mode polarization super junction GaN-based FET, at a non-operating time (thermal equilibrium state), $n_0 \leq n_1 < n_2 < n_3$ is satisfied for the concentration $n_0$ of the 2DEG 22 just below the gate electrode 20, the concentration $n_1$ of the 2DEG 22 just below the gate electrode 16, the concentration $n_2$ of the 2DEG 22 in the polarization super junction region and the concentration $n_3$ of the 2DEG 22 in the part between the polarization super junction region and the drain electrode 18. The concentration of the 2DEG 22 in the part between the gate electrode 20 and the source electrode 17 is also $n_3$. In FIG. 1, the magnitude relation of $n_0 \leq n_1 < n_2 < n_3$ is schematically shown by the size of circle denoting electron and its density. In this case, the concentration $n_0$ of the 2DEG 22 just below the gate electrode 20 is sufficiently low such that the 2DEG 22 is almost depleted. Therefore, the electron channel made of the 2DEG 22 is interrupted just below the gate electrode 20. Typically, $n_0 < (1/1000) \times n_3$ is satisfied. On the other hand, for the concentration $p_1$ of the 2DHG 21 just below the gate electrode 16 and the concentration $p_2$ of the 2DHG 21 in the polarization super junction region, $p_1 > p_2$ is generally satisfied.

Figure 2:
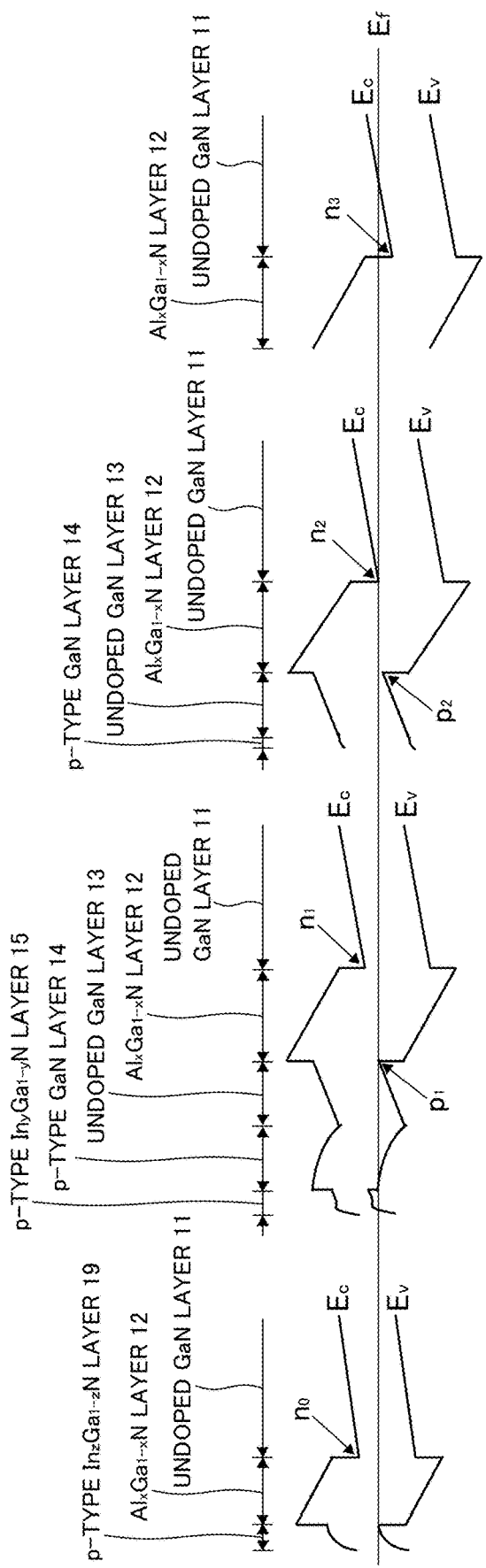
FIG. 2 A schematic view showing an energy band diagram of each region of the normally-off mode polarization super junction GaN-based FET according to the first embodiment of the invention.

FIG. 2 shows the energy band diagram of each region of the normally-off mode polarization super junction GaN-based FET in the direction vertical to the substrate 10. Shown in FIG. 2 from the left in order are the energy band diagram in the part just below the gate electrode 20, the energy band diagram in the part just below the gate electrode 16, the energy band diagram in the part of the polarization super junction region and the energy band diagram in the part between the polarization super junction region and the drain electrode 18. These energy band diagrams show qualitatively the relative concentration of the 2DEG 22 and the 2DHG 21 in each part. In FIG. 2, the ordinate denotes electron energy, $E_c$ denotes energy of the bottom end of the conduction band, $E_v$ denotes energy of the upper end of the valence band and $E_f$ denotes Fermi energy. As shown in FIG. 2, the 2DEG 22 of the concentration $n_3$ is formed in the undoped GaN layer 11 in the vicinity part of the hetero-interface between the undoped GaN layer 11 and the $Al_xGa_{1-x}N$ layer 12 in the part between the polarization super junction region and the drain electrode 18. In the polarization super junction region, the conduction band is lifted up due to the polarization effect by the undoped GaN layer 13 and the p-type GaN layer 14. As a result, the concentration $n_2$ of the 2DEG 22 formed in the undoped GaN layer 11 in the vicinity part of the hetero-interface between the undoped GaN layer 11 and the $Al_xGa_{1-x}N$ layer 12 is lower than the concentration $n_3$. In the polarization super junction region, the valence band is lifted up due to the same effect and therefore the 2DHG 21 of the concentration $p_2$ is formed in the valence band in the vicinity part of the hetero-interface between the undoped GaN layer 13 and the $Al_xGa_{1-x}N$ layer 12. In the part of the gate electrode 16, the conduction band is further lifted up by the p-type $In_yGa_{1-y}N$ layer 15 and therefore the concentration $n_1$ of the 2DEG 22 formed in the undoped GaN layer 11 in the vicinity part of the hetero-interface between the undoped GaN layer 11 and the $Al_xGa_{1-x}N$ layer 12 is lower than the concentration $n_2$. In the part of the gate electrode 16, the valence band is further lifted up due to the same effect. As a result, the 2DHG 21 of the concentration $p_1$ larger than the concentration $p_2$ is formed in the valence band in the vicinity part of the hetero-interface between the undoped GaN layer 13 and the $Al_xGa_{1-x}N$ layer 12. In the part of the gate electrode 20, due to the polarization effect by the p-type $In_zGa_{1-z}N$ layer 19, the concentration $n_0$ of the 2DEG 22 is extremely small concentration at least less than $n_1$, which is substantially 0 such that the electron channel made of the 2DEG is interrupted in the part.

[Operation Mechanism of the Normally-Off Mode Polarization Super Junction GaN-Based FET]

Figure 3:
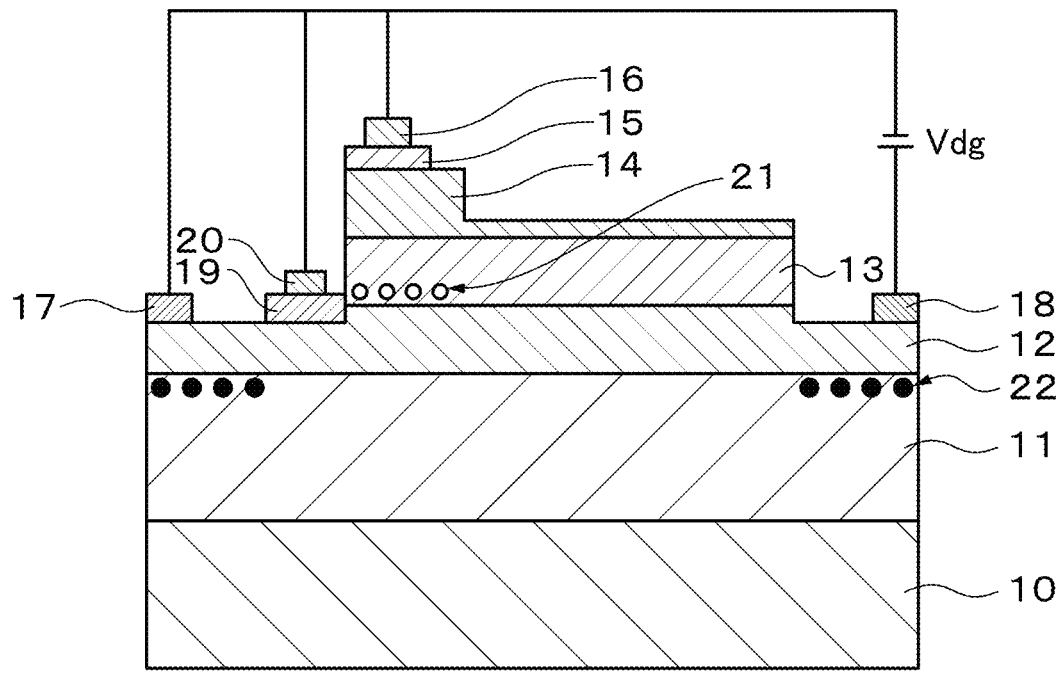
FIG. 3 A cross-sectional view for explaining operation mechanism of the normally-off mode polarization super junction GaN-based FET according to the first embodiment of the invention.

As shown in FIG. 3, the source electrode 17, the gate electrode 16 and the gate electrode 20 are connected each other and a positive voltage $V_{dg}$ is applied to the drain electrode 18 with respect to the source electrode 17, the gate electrode 16 and the gate electrode 20. In this case, the gate electrode 16 and the drain electrode 18 are reverse biased and the gate electrode 20 and the drain electrode 18 are reverse biased. As a result, holes of the 2DHG 21 in the polarization super junction region are extracted from the gate electrode 16 and electrons of the 2DEG 22 in the polarization super junction region are extracted from the drain electrode 18. The concentration $n_0$ of the 2DEG 22 just below the gate electrode 20 is substantially 0, so that no electric current flow from the source electrode 17 to the drain electrode 18 via the 2DEG 22. That is, the FET is normally-off.

Figure 4:
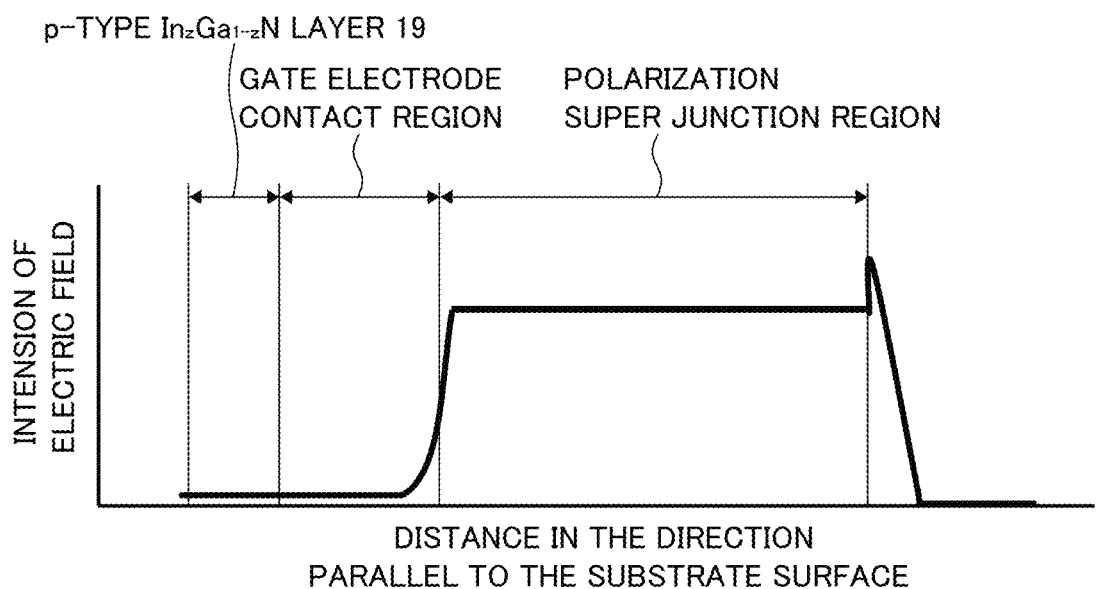
FIG. 4 A schematic view showing a distribution of electric field when a reverse bias is applied between the drain and the source and 0 V is applied between the gate and the source in the normally-off mode polarization super junction GaN-based FET according to the first embodiment of the invention.
Figure 5:
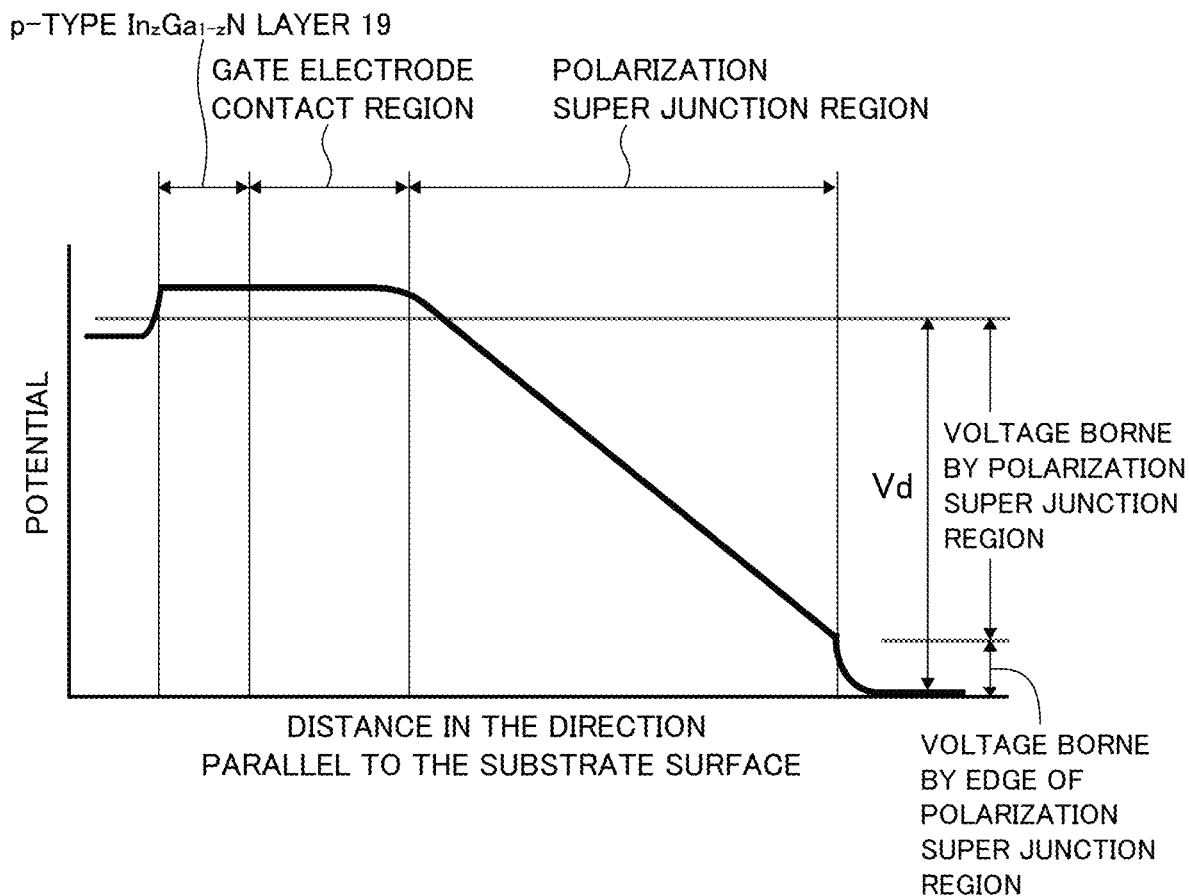
FIG. 5 A schematic view showing a distribution of potential when a reverse bias is applied between the drain and the source and 0 V is applied between the gate and the source in the normally-off mode polarization super junction GaN-based FET according to the first embodiment of the invention.

Electric field distribution and potential distribution of the normally-off mode polarization super junction GaN-based FET in this state are shown in FIG. 4 and FIG. 5, respectively. As shown in FIG. 4, the electric field is almost uniform in the polarization super junction region. Therefore, as shown in FIG. 5, the potential decreases gently toward the drain electrode 18 in the polarization super junction region. As shown in FIG. 4, at the end of the polarization super junction region on the side of the drain electrode 18, the peak electric field results at the connection point between the 2DEG 22 of the concentration $n_2$ and the 2DEG 22 of the concentration $n_3$, but the voltage borne by the polarization super junction region itself is much larger than the voltage borne by the peak electric field. That is, the voltage which causes breakdown of the normally-off mode polarization super junction GaN-based FET is borne by the polarization super junction region itself, which raises remarkably the voltage resistance. Therefore, the normally-off mode polarization super junction GaN-based FET can obtain high voltage resistance while keeping normally-off state.

[Method for Manufacturing the Normally-Off Mode Polarization Super Junction GaN-Based FET]

Figure 6:
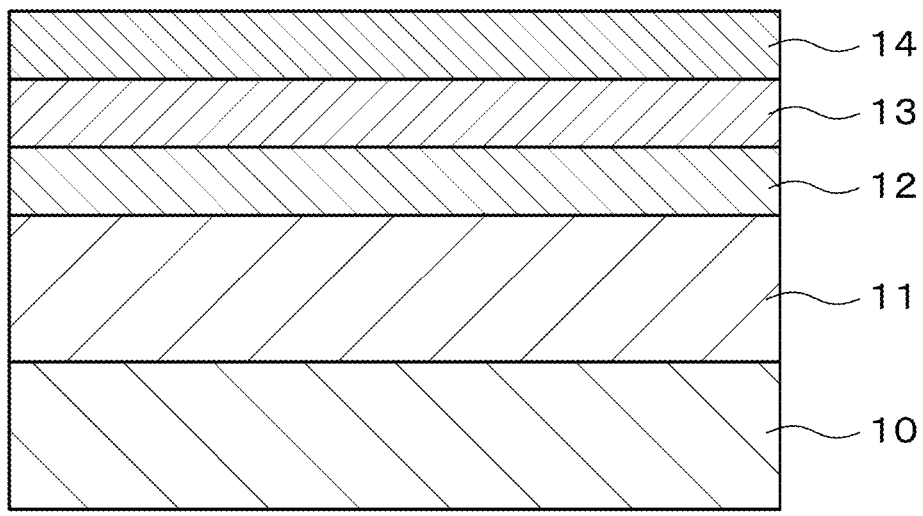
FIG. 6 A cross-sectional view for explaining the manufacturing method of the normally-off mode polarization super junction GaN-based FET according to the first embodiment of the invention.

First, as shown in FIG. 6, by the conventionally known MOCVD (metal organic chemical vapor deposition) method using TMG (trimethyl gallium) as Ga source, TMA (trimethyl aluminium) as Al source, $NH_3$ (ammonia) as nitrogen source, $N_2$ gas and $H_2$ gas as carrier gas, a buffer layer (not illustrated), the undoped GaN layer 11, the $Al_xGa_{1-x}N$ layer 12, the undoped GaN layer 13 and the p-type GaN layer 14 are epitaxially grown in order on the substrate 10. The growth temperature of the undoped GaN layer 11, the $Al_xGa_{1-x}N$ layer 12, the undoped GaN layer 13 and the p-type GaN layer 14 is, for example, about 1100° C. As the substrate 10, a sapphire substrate (for example, a C-plane sapphire substrate), a Si substrate, a SiC substrate and the like can be used. As the buffer layer, a GaN layer, an AlN layer, an AlGaN layer, an AlGaN/GaN superlattice layer and the like can be used. When, for example, the GaN layer is used as the buffer layer, it is grown in low temperature of, for example, about 530° C. As the p-type dopant for growing the p-type GaN layer 14, bis-cyclopentadienyl magnesium ($Cp_2$ Mg) is used. As the carrier gas for growing the p-type GaN layer 14, hydrogen ($H_2$) and nitrogen ($N_2$) are used.

Then, a mask such as a resist pattern having a shape corresponding to the device forming region is formed on the p-type GaN layer 14. Thereafter, the p-type GaN layer 14, the undoped GaN layer 13, the $Al_xGa_{1-x}N$ layer 12 and the undoped GaN layer 11 are etched in order to the depth midway in the thickness direction of the undoped GaN layer 11 using the mask to carry out patterning into the predetermined shape. As a result, device isolation is carried out. Thereafter, the mask is removed. The patterning can be carried out by etching using a reactive ion etching (RIE) method and the like.

Then, a mask such as a resist pattern having a planar shape corresponding to the p-type GaN layer 14 shown in FIG. 1 is formed on the p-type GaN layer 14. Thereafter, the p-type GaN layer 14, the undoped GaN layer 13 and the $Al_xGa_{1-x}N$ layer 12 are etched in order to the depth midway in the thickness direction of the $Al_xGa_{1-x}N$ layer 12 using the mask to carry out patterning into the predetermined shape. The patterning can be carried out by etching using the RIE method and the like. Thereafter, the mask is removed.

Figure 7:
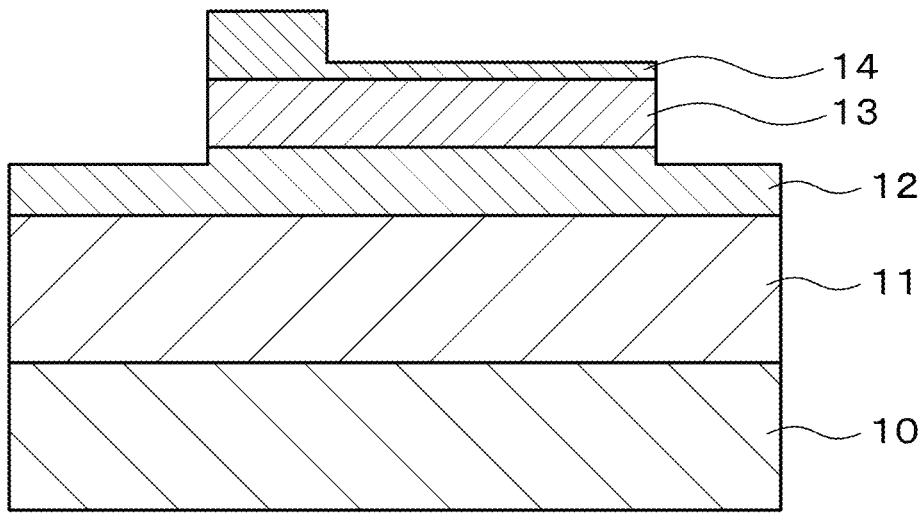
FIG. 7 A cross-sectional view for explaining the manufacturing method of the normally-off mode polarization super junction GaN-based FET according to the first embodiment of the invention.

Then, a mask such as a resist pattern is formed on the surface of the region except the polarization super junction region. Thereafter, the p-type GaN layer 14 is etched to the depth midway in the thickness direction of the p-type GaN layer 14 using the mask to carry out thinning. The etching can be carried out by the RIE method and the like. Thereafter, the mask is removed. This state is shown in FIG. 7.

Figure 8:
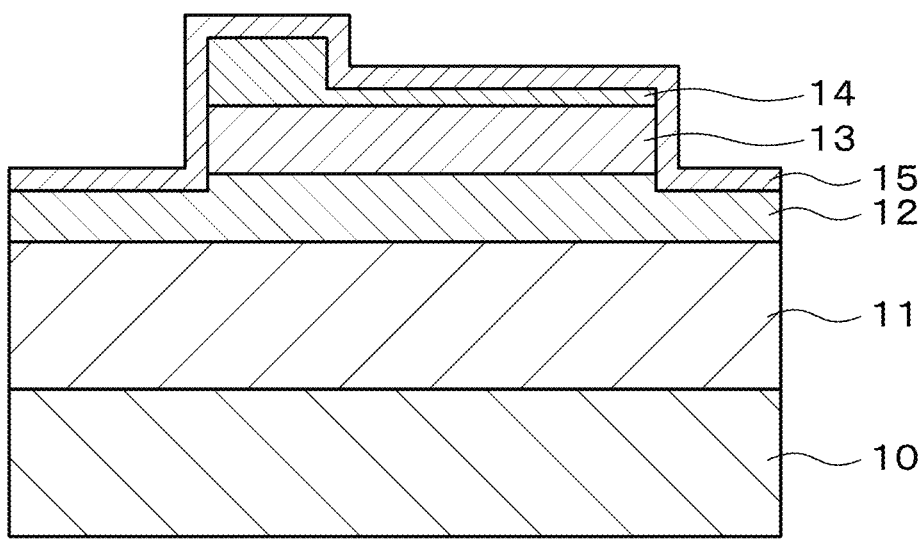
FIG. 8 A cross-sectional view for explaining the manufacturing method of the normally-off mode polarization super junction GaN-based FET according to the first embodiment of the invention.

Then, as shown in FIG. 8, the p-type $In_yGa_{1-y}N$ layer 15 is grown on the whole surface by, for example, the MOCVD method, the sputtering method and the like.

Figure 9:
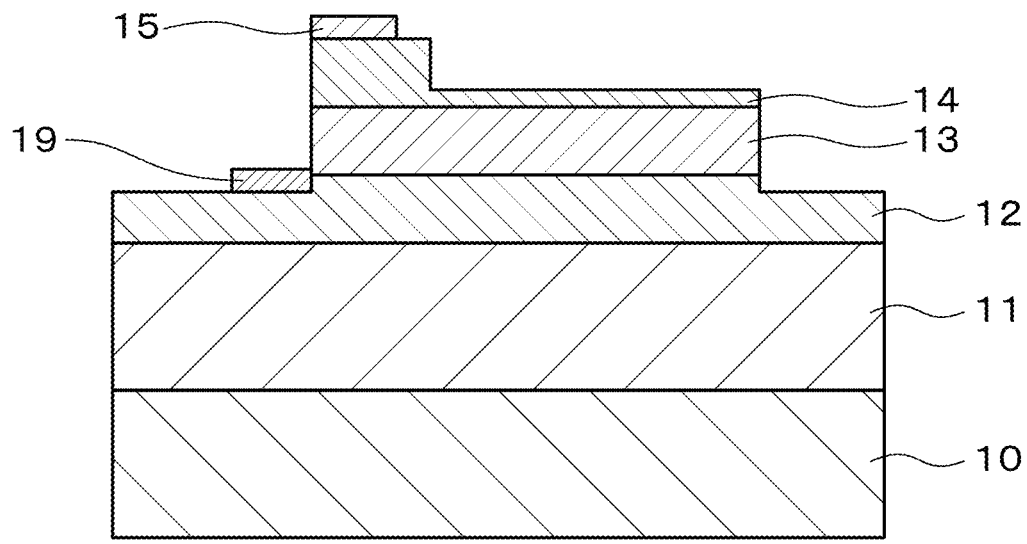
FIG. 9 A cross-sectional view for explaining the manufacturing method of the normally-off mode polarization super junction GaN-based FET according to the first embodiment of the invention.

Then, as shown in FIG. 9, for example, the p-type $In_yGa_{1-y}N$ layer 15 is patterned to leave the part on the thicker part of the p-type GaN layer 14 and the part beside the end of the island-like undoped GaN layer 13 on the side of the source electrode 17. The patterning can be carried out by, for example, the RIE method, the wet etching method and the like. The p-type $In_yGa_{1-y}N$ layer 15 left at the part beside the end of the island-like undoped GaN layer 13 on the side of the source electrode 17 forms the p-type $In_zGa_{1-z}N$ layer 19. That is, in this case, the p-type $In_zGa_{1-z}N$ layer 19 is formed by the p-type $In_yGa_{1-y}N$ layer 15 and z=y.

Then, the source electrode 17 and the drain electrode 18 are formed on the $Al_xGa_{1-x}N$ layer 12. Thereafter, the gate electrode 16 is formed on the p-type $In_yGa_{1-y}N$ layer 15 on the p-type GaN layer 14 and the gate electrode 20 is formed on the p-type $In_zGa_{1-z}N$ layer 19 on the $Al_xGa_{1-x}N$ layer 12.

In this way, the target normally-off mode polarization super junction GaN-based FET shown in FIG. 1 is manufactured.

Example

The normally-off mode polarization super junction GaN-based FET was prepared and various evaluations were carried out.

That is, first, a C-plane sapphire substrate was used as the substrate 10 and a GaN low temperature buffer layer having a thickness of 30 nm, the undoped GaN layer 11 having a thickness of 3000 nm, the $Al_xGa_{1-x}N$ layer 12 having a thickness of 30 nm and x=0.21, the undoped GaN layer 13 having a thickness of 50 nm and the p-type GaN layer 14 having a thickness of 40 nm and Mg concentration [Mg]=$5\times10^{19}$ cm$^{-3}$ were epitaxially grown in order. The growth temperature of the undoped GaN layer 11, the $Al_xGa_{1-x}N$ layer 12, the undoped GaN layer 13 and the p-type GaN layer 14 was set to 1100° C. As carrier gas during growth, $N_2$ gas and $H_2$ gas were used. As the p-type dopant for growing the p-type GaN layer 14, $Cp_2$ Mg was used.

Then, the surface of the p-type GaN layer 14 in the device isolation region was masked and etching for device isolation was carried out by ICP (induction coupled plasma)-RIE using chlorine (Cl)-based gas until the upper part of the undoped GaN layer 11 was etched.

Then, the surface of the parts of the p-type GaN layer 14 corresponding to the gate electrode contact region and the polarization super junction region was masked and the p-type GaN layer 14, the undoped GaN layer 13 and the $Al_xGa_{1-x}N$ layer 12 were etched in order until the remained thickness of the $Al_xGa_{1-x}N$ layer 12 reaches 15 nm.

Then, the surface of the region except the polarization super junction region was masked and etching was carried out to thin the p-type GaN layer 14 in the polarization super junction region.

Then, the p-type $In_yGa_{1-y}N$ layer 15 having a thickness of 5 nm, x=0.18 and [Mg]=$1\times10^{20}$ cm$^{-3}$ by the MOCVD method. The growth temperature of the p-type $In_yGa_{1-y}N$ layer 15 was set to 950° C. As carrier gas during growth 100% $N_2$ was used.

Then, the surface of the parts of the p-type $In_yGa_{1-y}N$ layer 15 on which the gate electrode 16 and the gate electrode 20 are formed was masked and etching of the p-type $In_yGa_{1-y}N$ layer 15 was carried out by ICP-RIE using Cl-based gas to leave the p-type $In_yGa_{1-y}N$ layer 15 only in the parts on which the gate electrode 16 and the gate electrode 20 are to be formed.

Then, the surface of the region except the region on which the source electrode 17 and the drain electrode 18 are to be formed was masked by an $SiO_2$ film and a Ti/Al/Ni/Au layered film was formed on the source electrode forming part and the drain electrode forming part by the vacuum evaporation method to form the source electrode 17 and the drain electrode 18. Thereafter, ohmic alloy treatment of 800° C. and 60 seconds was carried out in $N_2$.

Then, the surface of the region except the region on which the gate electrode 16 and the gate electrode 20 are to be formed was masked by an $SiO_2$ film and a Ti/Ni/Au layered film was formed on the p-type $In_yGa_{1-y}N$ layer 15 beside the edge of the undoped GaN layer 13 on the side of the source electrode 17 by the vacuum evaporation method to form the gate electrode 16 and the gate electrode 20. Thereafter, ohmic alloy treatment was carried out by carrying out a rapid thermal annealing (RTA) of 500° C. and 100 seconds in $N_2$. In this case, the p-type $In_zGa_{1-z}N$ layer 19 was formed by the p-type $In_yGa_{1-y}N$ layer 15.

In this way, the normally-off mode polarization super junction GaN-based FET was prepared. Regarding the normally-off mode polarization super junction GaN-based FET, the PSJ length was 15 μm, the gate length of the gate electrode 16 was 5 μm, the gate width was 100 mm, the gate length of the gate electrode 20 was 5 μm, the gate width was 100 mm, the distance between the end of the polarization super junction region on the side of the drain electrode 18 and the drain electrode 18 was 3 μm and the thickness of the $Al_xGa_{1-x}N$ layer 12 just below the gate electrode 20 was about 15 nm.

Figure 10:
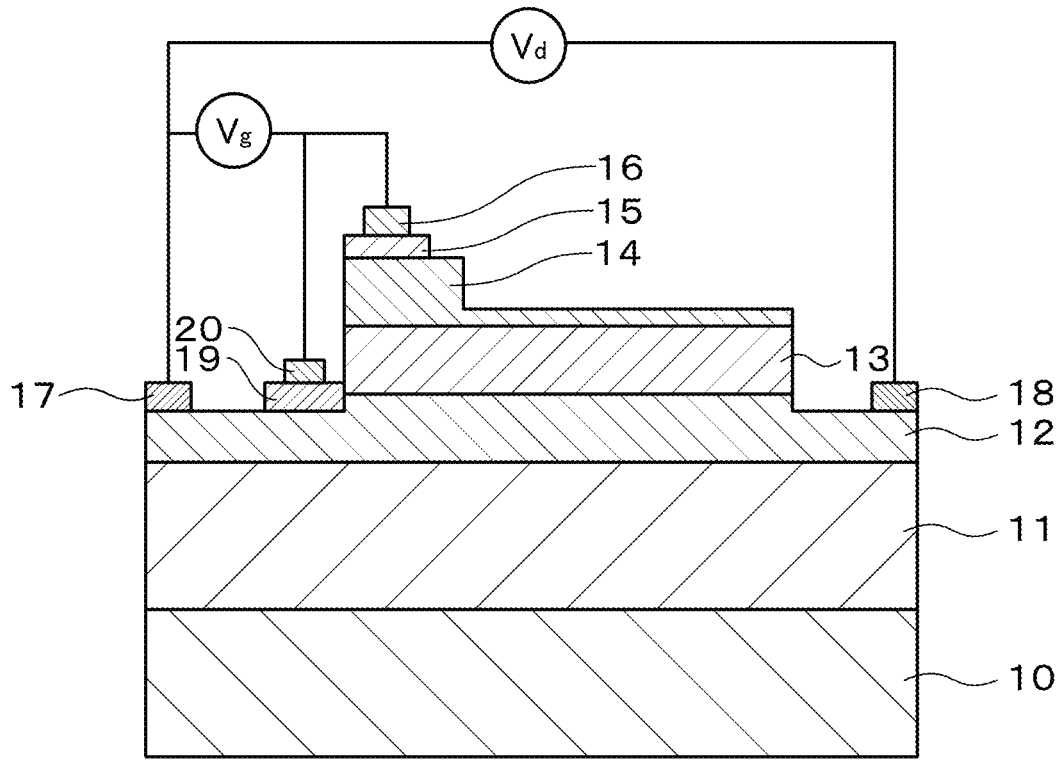
FIG. 10 A circuit diagram showing a measurement circuit used to measure static characteristics of the normally-off mode polarization super junction GaN-based FET according to the example.

In order to investigate electric characteristics of the normally-off mode polarization super junction GaN-based FET prepared as described above, a measurement circuit connected as shown in FIG. 10 was formed. And static characteristics of the FET were measured as a three-terminal element in which the gate electrode 16 and the gate electrode 20 were common.

(Drain Current ($I_d$)–Drain Voltage ($V_d$) Characteristics)

Figure 11:
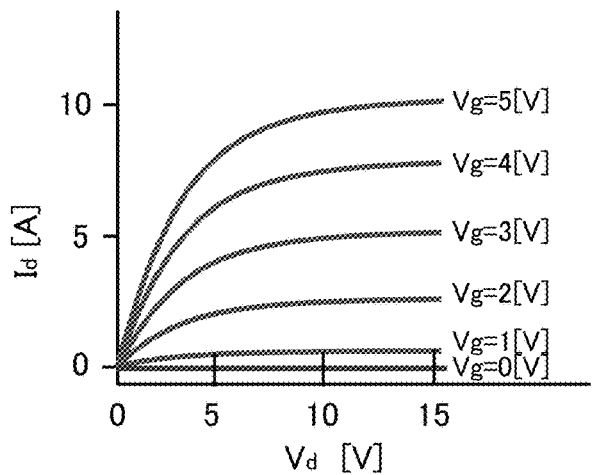
FIG. 11 A schematic view showing the drain current-drain voltage characteristics of the normally-off mode polarization super junction GaN-based FET according to the example.

FIG. 11 shows the result of measurement of the $I_d$-$V_d$ characteristics in which the gate voltage $V_g$ is used as parameters. As shown in FIG. 11, $I_d$ was almost 0 [A] at $V_g$=0.

(Drain Current ($I_d$)–Gate Voltage ($V_g$) Characteristics)

Figure 12:
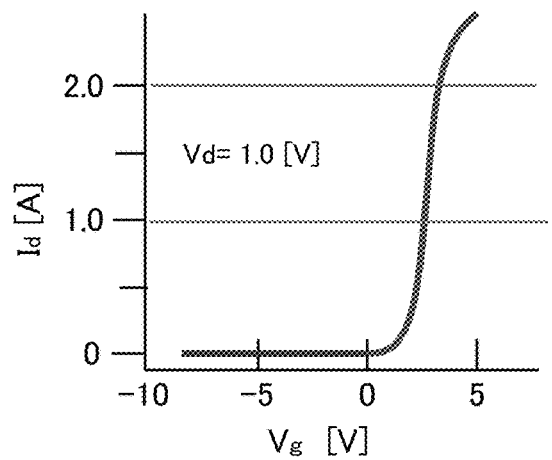
FIG. 12 A schematic view showing the drain current-gate voltage characteristics of the normally-off mode polarization super junction GaN-based FET according to the example.
Figure 13:
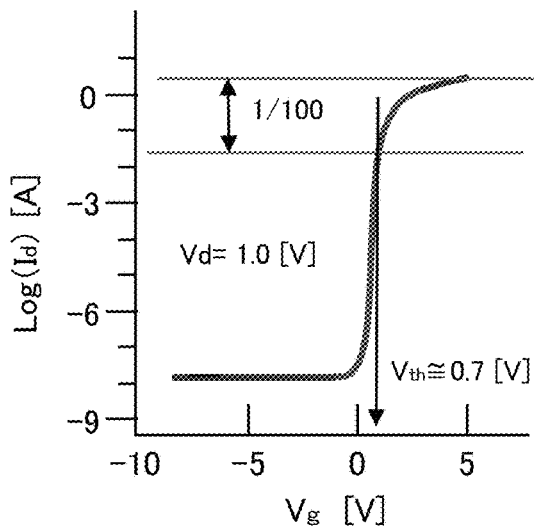
FIG. 13 A schematic view showing the logarithmic presentation of the drain current of the drain current-gate voltage characteristics shown in FIG. 12.

FIG. 12 shows the result of measurement of the $I_d$-$V_g$ characteristics when $V_d$=1.0 [V] was set. As shown in FIG. 12, $I_d$ rises over $V_g$=0 [V]. FIG. 13 shows the $I_d$-$V_g$ characteristics shown in FIG. 12 in which logarithmic representation of $I_d$ was adopted to obtain high resolution. In FIG. 13, rising of $I_d$ over $V_g$=0 [V] is clearly shown. If the threshold voltage $V_{th}$ is defined as $V_g$ when the drain current $I_d$ is about 1/100 ($2.5 \times 10^{-2}$ [A]) of the rated drain current of the FET (in this FET, $I_d$~2.5 [A] when $V_d$=1 [V] and $V_g$=5 [V]), $V_{th}$ is about 0.7 [V]. That is, it is apparent that normally-off mode was realized. Here, $V_{th}$ was defined as $V_g$ when the drain current $I_d$ is 1/100 of the maximum rated drain current because the circuit system can be substantially protected by the normally-off mode FET when the gate signal was lost.

(Off Voltage Resistance Characteristic)

Figure 14:
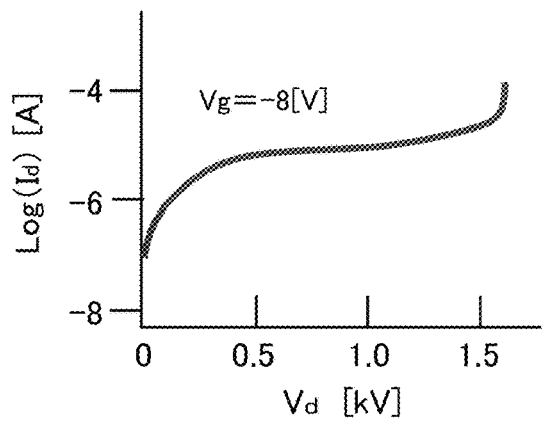
FIG. 14 A schematic view showing the voltage resistance characteristics of the normally-off mode polarization super junction GaN-based FET according to the example.

FIG. 14 shows the result of measurement of $I_d$ for $V_d$ when the normally-off mode polarization super junction GaN-based FET was in an off-state by setting $V_g$=−8 [V]. The ordinate of FIG. 14 is the logarithmic axis. As shown in FIG. 14, in the normally-off mode polarization super junction GaN-based FET, $I_d$~30 [μA] when $V_d$~1.5 [kV], which means that very high voltage resistance was obtained.

Figure 15A:
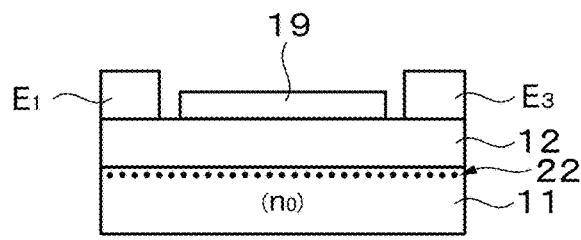
FIG. 15A A cross-sectional view showing the Hall element prepared to measure the concentration of the two-dimensional electron gas and the concentration of the two-dimensional hole gas in the particular region of the normally-off mode polarization super junction GaN-based FET according to the example.
Figure 15B:
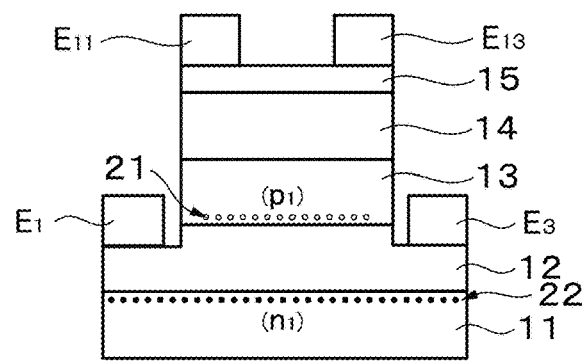
FIG. 15B A cross-sectional view showing the Hall element prepared to measure the concentration of the two-dimensional electron gas and the concentration of the two-dimensional hole gas in the particular region of the normally-off mode polarization super junction GaN-based FET according to the example.
Figure 15C:
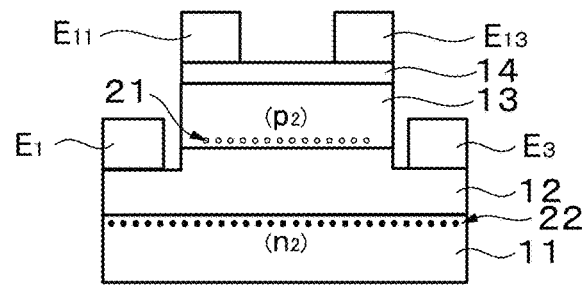
FIG. 15C A cross-sectional view showing the Hall element prepared to measure the concentration of the two-dimensional electron gas and the concentration of the two-dimensional hole gas in the particular region of the normally-off mode polarization super junction GaN-based FET according to the example.
Figure 15D:
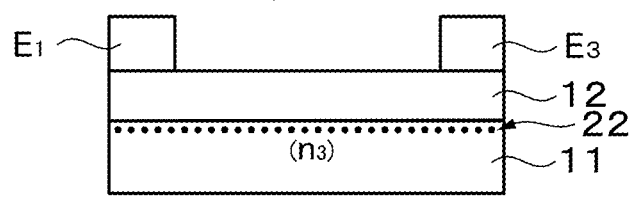
FIG. 15D A cross-sectional view showing the Hall element prepared to measure the concentration of the two-dimensional electron gas and the concentration of the two-dimensional hole gas in the particular region of the normally-off mode polarization super junction GaN-based FET according to the example.
Figure 16A:
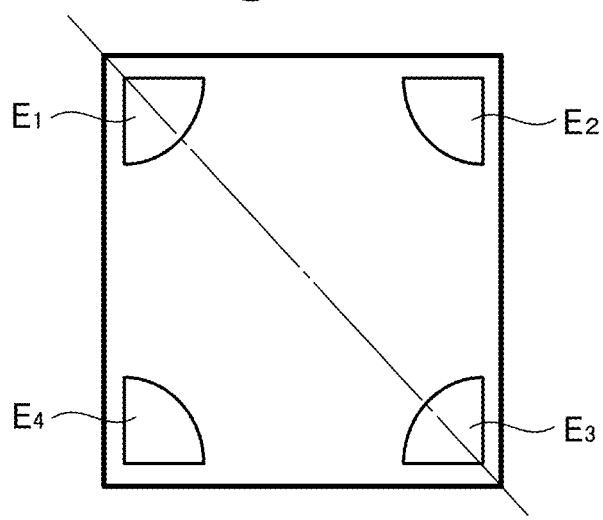
FIG. 16A A plan view showing electrode arrangement of the Hall element shown in FIG. 15A and FIG. 15D.
Figure 16B:
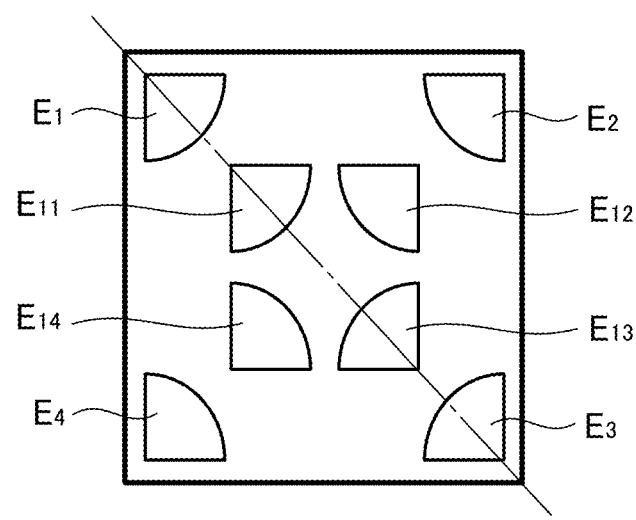
FIG. 16B A plan view showing electrode arrangement of the Hall element shown in FIG. 15B and FIG. 15C.

The concentration of the 2DEG 22 and the concentration of the 2DHG 21 of each region in the normally-off mode polarization super junction GaN-based FET were measured. And it was demonstrated that $n_0 \leq n_1 < n_2 < n_3$ and $p_1 > p_2$ were satisfied. The result is now described. Hall elements were prepared to measure the concentration of the 2DEG 22 and the concentration of the 2DHG 21 of each region. More specifically, a Hall element $H_1$ shown in FIG. 15A which has the same layer structure as the part of the 2DEG 22 having the concentration $n_0$ shown in FIG. 1 was prepared to measure $n_0$. A Hall element $H_2$ shown in FIG. 15B which has the same layer structure as the part of the 2DEG 22 having the concentration $n_1$ and the 2DHG 21 having the concentration $p_1$ shown in FIG. 1 was prepared to measure $n_1$ and $p_1$. A Hall element $H_3$ shown in FIG. 15C which has the same layer structure as the part of the 2DEG 22 having the concentration $n_2$ and the 2DHG 21 having the concentration $p_2$ shown in FIG. 1 was prepared to measure $n_2$ and $p_2$. A Hall element $H_4$ shown in FIG. 15D which has the same layer structure as the part of the 2DEG 22 having the concentration $n_3$ shown in FIG. 1 was prepared to measure $n_3$. FIG. 16A shows electrode arrangement of the Hall elements $H_1$, $H_4$ and FIG. 16B shows electrode arrangement of the Hall elements $H_2$, $H_3$. FIG. 15A and FIG. 15D show cross-sectional views along a dashed-and-dotted line of FIG. 16A. FIG. 15B and FIG. 15C show cross-sectional views along a dashed-and-dotted line of FIG. 16B. Sizes of the Hall elements $H_1$~$H_4$ were about 4×4 mm². As shown in FIG. 16A, in the Hall elements $H_1$, $H_4$, four electrodes $E_1$~$E_4$ were formed on the $Al_xGa_{1-x}N$ layer 12 to measure the concentration of the 2DEG 22. As shown in FIG. 16B, in the Hall elements $H_2$, $H_3$, the electrodes $E_1$~$E_4$ were formed on the $Al_xGa_{1-x}N$ layer 12 to measure the concentration of the 2DEG 22 and further four electrodes $E_{11}$~$E_{14}$ were formed on the p-type $In_yGa_{1-y}N$ layer 15 to measure the concentration of the 2DHG 21. These Hall elements $H_1$~$H_4$ were prepared by the same process as the one used to prepare the normally-off mode polarization super junction GaN-based FET.

The result of measurement of the concentration $n_0$, electron mobility $\mu_e$ and the resistance R by the Hall element $H_1$ is shown in table 1.

TABLE 1

| | |
|---|---|
| $n_0$ [cm$^{-2}$] | UNMEASURABLE |
| $\mu_e$ [cm²/Vs] | UNMEASURABLE |
| R [Ω/□] | UNMEASURABLE |

The result of measurement of the concentration $n_1$, electron mobility $\mu_e$ and the resistance R by the Hall element $H_2$ is shown in table 2.

TABLE 2

| | |
|---|---|
| $n_1$ [cm$^{-2}$] | 4.5 × 10$^{12}$ |
| $\mu_e$ [cm²/Vs] | 990 |
| R [Ω/□] | 1403 |

The result of measurement of the concentration $p_1$, hole mobility $\mu_p$ and the resistance R by the Hall element $H_2$ is shown in table 3.

TABLE 3

| | |
|---|---|
| $p_1$ [cm$^{-2}$] | 5.1 × 10$^{12}$ |
| $\mu_p$ [cm²/Vs] | 14 |
| R [kΩ/□] | 87.5 |

The result of measurement of the concentration $n_2$, electron mobility $\mu_e$ and the resistance R by the Hall element $H_3$ is shown in table 4.

TABLE 4

| | |
|---|---|
| $n_2$ [cm$^{-2}$] | 6.5 × 10$^{12}$ |
| $\mu_e$ [cm²/Vs] | 990 |
| R [Ω/□] | 971 |

The result of measurement of the concentration $p_2$, hole mobility $\mu_p$ and the resistance R by the Hall element $H_3$ is shown in table 5.

TABLE 5

| | |
|---|---|
| $p_2$ [cm$^{-2}$] | 3.1 × 10$^{12}$ |
| $\mu_p$ [cm²/Vs] | 8.6 |
| R [kΩ/□] | 234 |

The result of measurement of the concentration $n_3$, electron mobility $\mu_e$ and the resistance R by the Hall element $H_4$ is shown in table 6.

TABLE 6

| | |
|---|---|
| $n_3$ [cm$^{-2}$] | $9.1 \times 10^{12}$ |
| $\mu_e$ [cm$^2$/Vs] | 980 |
| R [Ω/□] | 700 |

From tables 1~6, it is understood that $n_0 \leq n_1 < n_2 < n_3$ and $p_1 > p_2$ are certainly satisfied.

[Modes of Usage of the Normally-Off Mode Polarization Super Junction GaN-Based FET]

The normally-off mode polarization super junction GaN-based FET is a 2-gate transistor which operates according to AND. When both of the gate electrode 16 and the gate electrode 20 are on, the drain current flows. When either of the gate electrode 16 and the gate electrode 20 is off, the drain current does not flow. However, since the gate electrode 16 is normally-on, the FET can be operated as a normally-off mode transistor by the gate electrode 20. In this case, three kinds of connecting ways are considered.

Figure 17A:
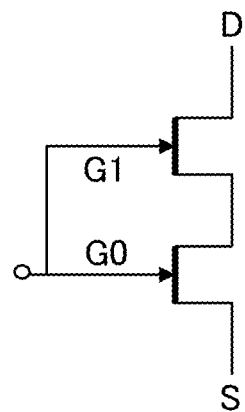
FIG. 17A A circuit diagram showing a first example of connecting way of terminals of the normally-off mode polarization super junction GaN-based FET according to the first embodiment of the invention.

FIG. 17A shows a case where the FET operates as a 3-terminal transistor by connecting the gate electrode 16 and the gate electrode 20. In FIG. 17A, the gate electrode 16 is denoted as G1, the gate electrode 20 is denoted as G0, the source electrode 17 is denoted as S and the drain electrode 18 is denoted as D (hereinafter the same).

Figure 17B:
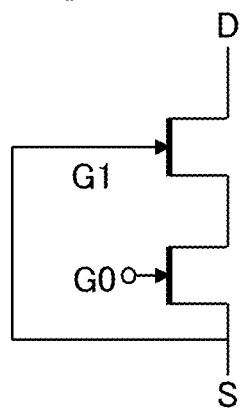
FIG. 17B A circuit diagram showing a second example of connecting way of terminals of the normally-off mode polarization super junction GaN-based FET according to the first embodiment of the invention.

FIG. 17B shows a case where the FET operates like an internal cascode by connecting the gate electrode 16 and the source electrode 17.

Figure 17C:
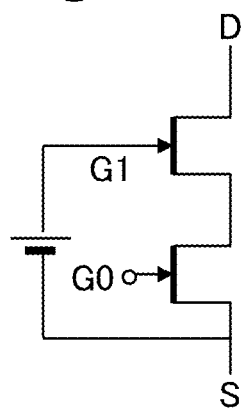
FIG. 17C A circuit diagram showing a third example of connecting way of terminals of the normally-off mode polarization super junction GaN-based FET according to the first embodiment of the invention.

FIG. 17C shows a case where the FET operates as modified cascode by applying a positive voltage to the gate electrode 16 with respect to the source electrode 17.

The connecting ways shown in FIG. 17A, FIG. 17B and FIG. 17C are logically identical, although transient characteristics upon switching may be different. Therefore, it is possible to change connecting way depending on circuits to which the normally-off mode polarization super junction GaN-based FET is applied.

Figure 17D:
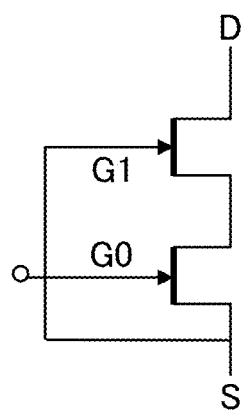
FIG. 17D A circuit diagram showing a fourth example of connecting way of terminals of the normally-off mode polarization super junction GaN-based FET according to the first embodiment of the invention.

FIG. 17D shows a case where the source electrode 17 and the gate electrode 16 and the gate electrode 20 are connected and the FET operates as a diode.

As described above, according to the first embodiment, it is possible to easily realize a normally-off mode polarization super junction GaN-based FET in which the 2DEG 22 does not exist substantially in the part just below the gate electrode 20 at a non-operating time (thermal equilibrium state) without using complicated circuits such as a cascode circuit or modified cascode circuit using low voltage resistance normally-off mode Si MOS transistors because the FET has the layer structure of the undoped GaN layer 11, the $Al_xGa_{1-x}N$ layer 12, the undoped GaN layer 13, the p-type GaN layer 14 and the p-type $In_yGa_{1-y}N$ layer 15 and further the gate electrode 16 on the p-type $In_yGa_{1-y}N$ layer 15 and the gate electrode 20 on the p-type $In_zGa_{1-z}N$ layer 19 on the $Al_xGa_{1-x}N$ layer 12 and $n_0 \leq n_1 < n_2 < n_3$ and $p_1 > p_2$ are satisfied with respect to the concentration of the 2DEG 22 and the concentration of the 2DHG 21. Furthermore, the normally-off mode polarization super junction GaN-based FET can be used as transistors having various characteristics by choosing connecting way of each terminal or as diodes.

The Second Embodiment

[The Normally-Off Mode Polarization Super Junction GaN-Based FET]

Figure 18:
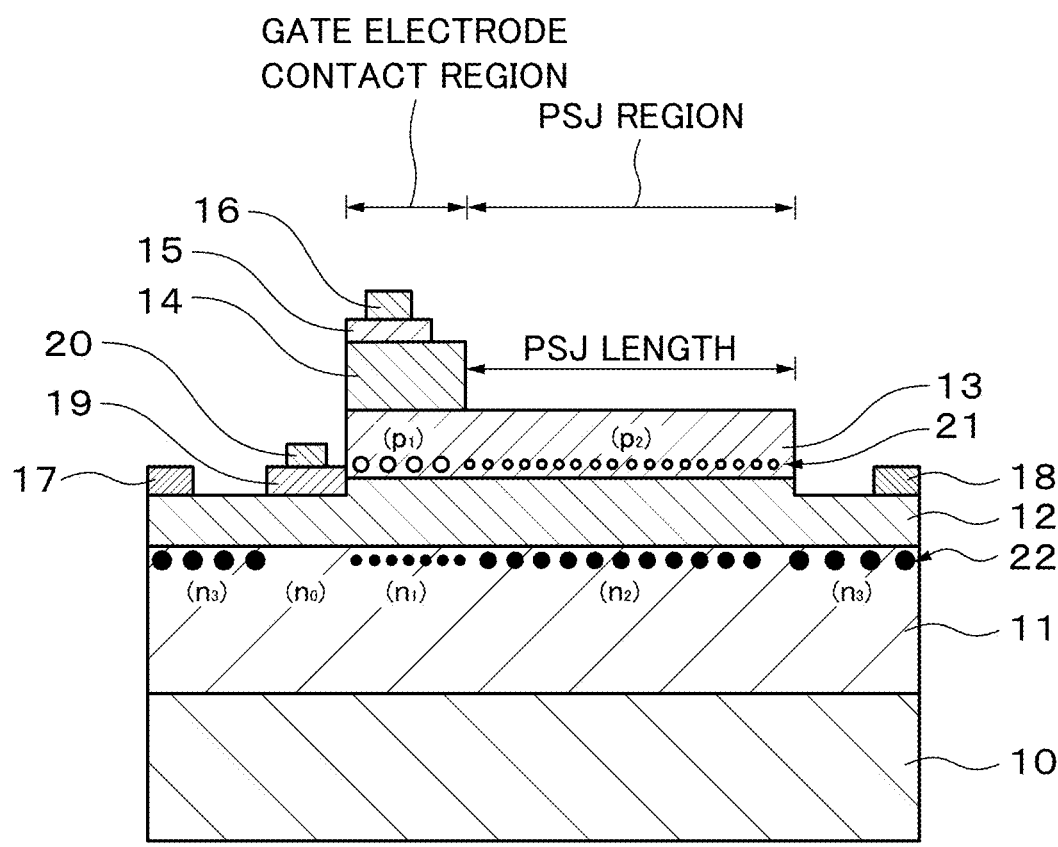
FIG. 18 A cross-sectional view showing a normally-off mode polarization super junction GaN-based FET according to a second embodiment of the invention.

As shown in FIG. 18, the normally-off mode polarization super junction GaN-based FET according to the second embodiment is different from the normally-off mode polarization super junction GaN-based FET according to the first embodiment in that the p-type GaN layer 14 does not exist in the polarization super junction region similarly to patent literature 1. Other than the above is the same as the normally-off mode polarization super junction GaN-based FET according to the first embodiment.

[Method for Manufacturing the Normally-Off Mode Polarization Super Junction GaN-Based FET]

The method for manufacturing the normally-off mode polarization super junction GaN-based FET is the same as the method for manufacturing the normally-off mode polarization super junction GaN-based FET according to the first embodiment except that the p-type GaN layer 14 is not finally formed on the undoped GaN layer 13 in the polarization super junction region.

According to the second embodiment, the same advantage as the first embodiment can be obtained.

The Third Embodiment

[The Normally-Off Mode Polarization Super Junction GaN-Based FET]

Figure 19:
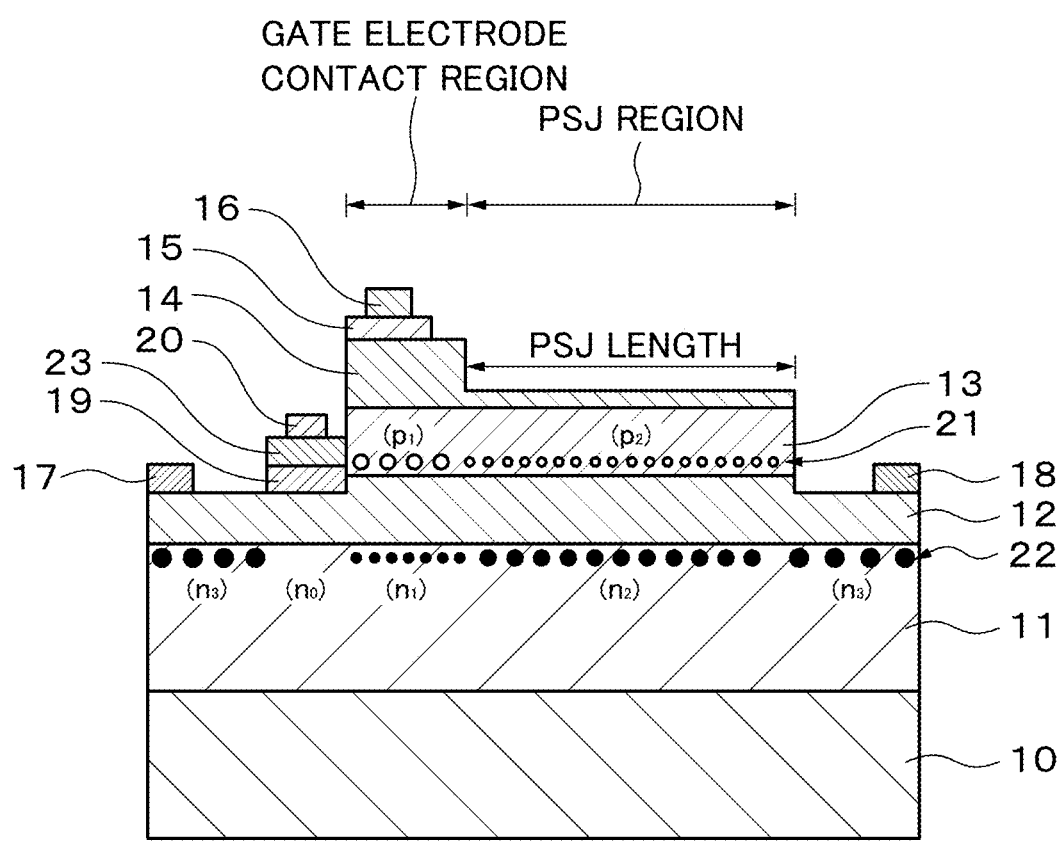
FIG. 19 A cross-sectional view showing a normally-off mode polarization super junction GaN-based FET according to a third embodiment of the invention.

As shown in FIG. 19, in the normally-off mode polarization super junction GaN-based FET, the gate electrode 20 is provided on the p-type $In_zGa_{1-z}N$ layer 19 via a gate insulating film 23. That is, a MIS structure is formed by the gate electrode 20, the gate insulating film 23 and the p-type $In_zGa_{1-z}N$ layer 19. That is, the part of the FET corresponding to the gate electrode 20 forms the MIS structure. Therefore, when a gate voltage not less than +3 V, for example, is applied to the gate electrode 20 to turn on the normally-off mode polarization super junction GaN-based FET from the off-state, even if a part of electron of the 2DEG 22 reaches the p-type $In_zGa_{1-z}N$ layer 19 through the $Al_xGa_{1-x}N$ layer 12, it does not reach the gate electrode 20 due to protection by the gate insulating film 23. As a result, it is possible to greatly reduce the gate current flowing through the channel. The gate insulating film 23 may be, for example, inorganic oxides, inorganic nitrides, inorganic oxynitrides and the like. More specifically, the gate insulating film 23 may be, for example, $Al_2O_3$, $SiO_2$, AlN, $SiN_x$, SiON and the like, but not limited to these. The thickness of the gate insulating film 23 is selected as necessary and for example, not smaller than 3 nm and not larger than 100 nm and is typically not smaller than 3 nm and not larger than 30 nm. Other than the above of the normally-off mode polarization super junction GaN-based FET is the same as the normally-off mode polarization super junction GaN-based FET according to the first embodiment.

Figure 20A:
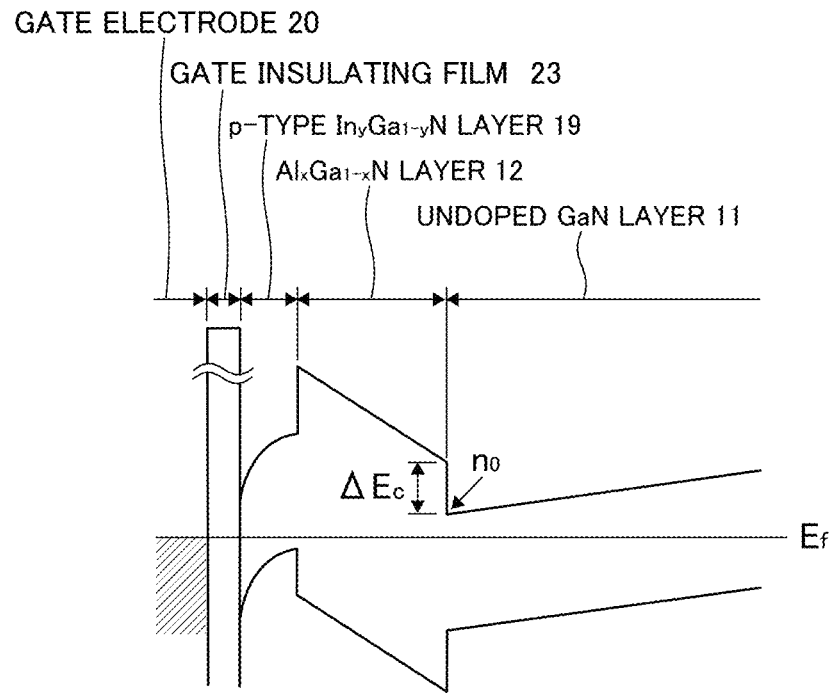
FIG. 20A A schematic view showing an energy band diagram of the region just below the gate electrode 20 of the normally-off mode polarization super junction GaN-based FET according to the third embodiment of the invention.
Figure 20B:
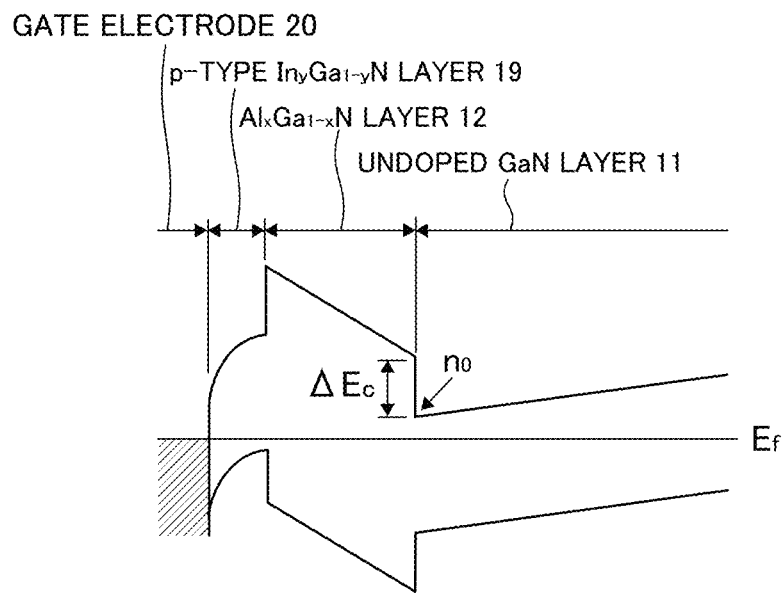
FIG. 20B A schematic view showing an energy band diagram of the region just below the gate electrode 20 of the normally-off mode polarization super junction GaN-based FET according to the first embodiment of the invention.
Figure 21A:
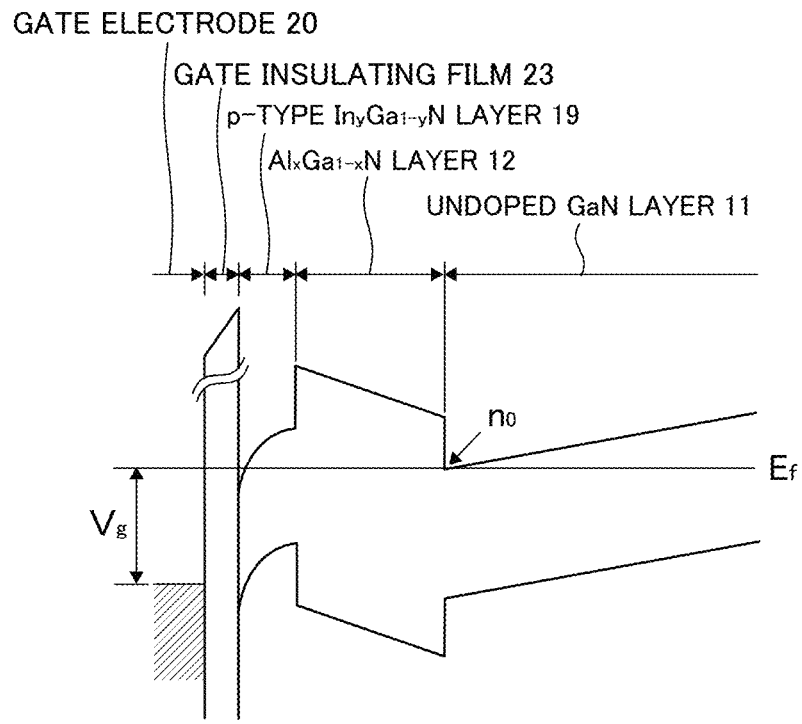
FIG. 21A A schematic view showing an energy band diagram of the region just below the gate electrode 20 of the normally-off mode polarization super junction GaN-based FET according to the third embodiment of the invention when the gate voltage is applied.
Figure 21B:
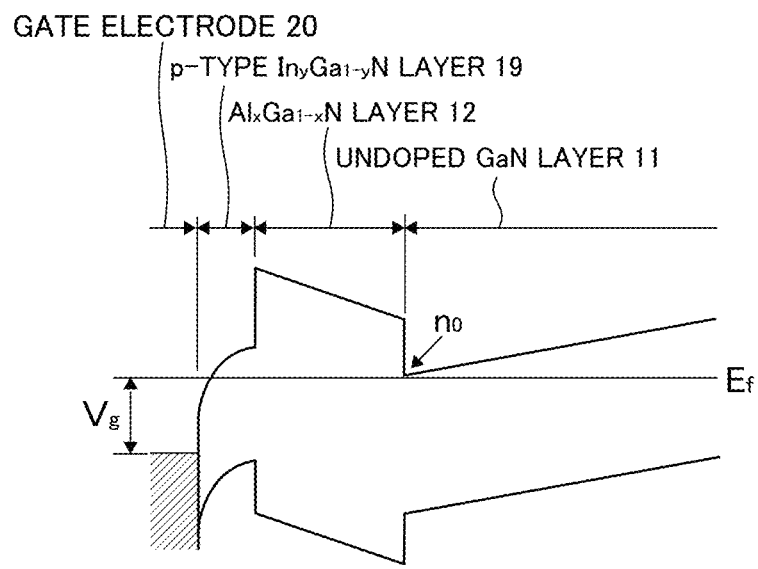
FIG. 21B A schematic view showing an energy band diagram of the region just below the gate electrode 20 of the normally-off mode polarization super junction GaN-based FET according to the first embodiment of the invention when the gate voltage is applied.

FIG. 20A shows an enlarged view of the energy band diagram of the part just below the gate electrode 20 of the normally-off mode polarization super junction GaN-based FET. In FIG. 20A, the gate insulating film 23 is assumed to be $SiN_x$ as an example. In FIG. 20A, $E_c$ denotes the difference (the value of discontinuity of the conduction band) between $E_c$ of the undoped GaN layer 11 and $E_c$ of the $Al_xGa_{1-x}N$ layer 12 in the hetero-interface between the undoped GaN layer 11 and the $Al_xGa_{1-x}N$ layer 12. FIG. 20B shows the energy band diagram of the part just below the gate electrode 20 of the normally-off mode polarization super junction GaN-based FET according to the first embodiment in which the gate electrode 20 is not provided on the p-type $In_zGa_{1-z}N$ layer 19 via the gate insulating film 23 and the gate electrode 20 is directly provided on the p-type $In_zGa_{1-z}N$ layer 19 for comparison with the normally-off mode polarization super junction GaN-based FET. The gate electrode 20 directly provided on the p-type $In_zGa_{1-z}N$ layer 19 is in Schottky contact with the p-type $In_zGa_{1-z}N$ layer 19. Comparing FIG. 20A and FIG. 20B, it is understood that the both energy band diagrams are substantially the same. FIG. 21A shows the energy band diagram of the normally-off mode polarization super junction GaN-based FET shown in FIG. 20A when a positive gate voltage $V_g$ is applied to the gate electrode 20. FIG. 21B shows the energy band diagram of the normally-off mode polarization super junction GaN-based FET according to the first embodiment shown in FIG. 20B when a positive gate voltage $V_g$ is applied to the gate electrode 20. The difference between the normally-off mode polarization super junction GaN-based FET shown in FIG. 20A and the normally-off mode polarization super junction GaN-based FET shown in FIG. 20B is only that in the former, the band of the gate insulating film 23 is bent as shown in FIG. 21A when the positive gate voltage $V_g$ is applied and therefore the positive gate voltage $V_g$ larger than that of the normally-off mode polarization super junction GaN-based FET according to the first embodiment shown in FIG. 20B is applied and similarly a larger negative gate voltage $V_g$ is applied when a negative gate voltage $V_g$ is applied.

[Operation Mechanism of the Normally-Off Mode Polarization Super Junction GaN-Based FET]

Operation mechanism of the normally-off mode polarization super junction GaN-based FET is basically the same as operation mechanism of the normally-off mode polarization super junction GaN-based FET according to the first embodiment. [Method for manufacturing the normally-off mode polarization super junction GaN-based FET]

After the step for forming the source electrode 17 and the drain electrode 18 on the $Al_xGa_{1-x}N$ layer 12 is implemented as the same as the first embodiment, the gate insulating film 23 is formed on the whole surface. Then, the gate insulating film 23 is etched off except the part on the p-type $In_zGa_{1-z}N$ layer 19. Then, the gate electrode 16 is formed on the p-type $In_yGa_{1-y}N$ layer 15 on the p-type GaN layer 14. And the gate electrode 20 is formed on the gate insulating film 23 formed on the p-type $In_zGa_{1-z}N$ layer 19 on the $Al_xGa_{1-x}N$ layer 12.

In this way, the target normally-off mode polarization super junction GaN-based FET shown in FIG. 19 is manufactured.

Example

First, a C-plane sapphire substrate was used as the substrate 10 and a GaN low temperature buffer layer having a thickness of 30 nm, the undoped GaN layer 11 having a thickness of 3000 nm, the $Al_xGa_{1-x}N$ layer 12 having a thickness of 30 nm and x=0.21, the undoped GaN layer 13 having a thickness of 50 nm and the p-type GaN layer 14 having a thickness of 40 nm and Mg concentration $[Mg]=5\times10^{19}$ $cm^{-3}$ were epitaxially grown in order. The growth temperature of the undoped GaN layer 11, the $Al_xGa_{1-x}N$ layer 12, the undoped GaN layer 13 and the p-type GaN layer 14 was set to 1100° C. As carrier gas during growth, $N_2$ gas and $H_2$ gas were used. As the p-type dopant for growing the p-type GaN layer 14, $Cp_2$ Mg was used.

Then, the surface of the p-type GaN layer 14 in the device isolation region was masked and etching for device isolation was carried out by ICP-RIE using Cl-based gas until the upper part of the undoped GaN layer 11 was etched.

Then, the surface of the parts of the p-type GaN layer 14 in the gate electrode contact region and the polarization super junction region was masked and the p-type GaN layer 14, the undoped GaN layer 13 and the $Al_xGa_{1-x}N$ layer 12 were etched in order until the remained thickness of the $Al_xGa_{1-x}N$ layer 12 reaches 15 nm.

Then, the surface of the region except the polarization super junction region was masked and etching was carried out to thin the p-type GaN layer 14 in the polarization super junction region.

Then, the p-type $In_yGa_{1-y}N$ layer 15 having a thickness of 5 nm, x=0.18 and $[Mg]=1\times10^{20}$ $cm^{-3}$ by the MOCVD method. The growth temperature of the p-type $In_yGa_{1-y}N$ layer 15 was set to 950° C. As carrier gas during growth 100% $N_2$ was used.

Then, the surface of the parts of the p-type $In_yGa_{1-y}N$ layer 15 on which the gate electrode 16 and the gate electrode 20 are to be formed was masked and etching was carried out by ICP-RIE using Cl-based gas to leave the p-type $In_yGa_{1-y}N$ layer 15 only in the region on which the gate electrode 16 and the gate electrode 20 are to be formed.

Then, the surface of the region except the region on which the source electrode 17 and the drain electrode 18 are to be formed was masked by an $SiO_2$ film and a Ti/Al/Ni/Au layered film was formed on the source electrode forming part and the drain electrode forming part by the vacuum evaporation method to form the source electrode 17 and the drain electrode 18. Thereafter, ohmic alloy treatment of 800° C. and 60 seconds was carried out in $N_2$.

Then, a $SiN_x$ film was formed on the whole surface as the gate insulating film 23. Thereafter, the $SiN_x$ film was etched off except the part on the p-type $In_yGa_{1-y}N$ layer 15 remained in the part on which the gate electrode 20 is to be formed. Then, the surface of the region except the region on which the gate electrode 16 and the gate electrode 20 are to be formed was masked by an $SiO_2$ film and a Ti/Ni/Au layered film was formed on the p-type $In_yGa_{1-y}N$ layer 15 on the p-type GaN layer 14 and on the $SiN_x$ film on the p-type $In_yGa_{1-y}N$ layer 15 beside the end of the undoped GaN layer 13 on the side of the source electrode 17 on the $Al_xGa_{1-x}N$ layer 12 by the vacuum evaporation method to form the gate electrode 16 and the gate electrode 20. Thereafter, ohmic alloy treatment of the gate electrode 16 was carried out by carrying out RTA of 500° C. and 100 seconds in $N_2$. In this case, the p-type $In_zGa_{1-z}N$ layer 19 was formed by the p-type $In_yGa_{1-y}N$ layer 15.

In this way, the normally-off mode polarization super junction GaN-based FET was prepared.

As described above, according to the third embodiment, it is possible to easily realize a normally-off mode polarization super junction GaN-based FET in which the 2DEG 22 does not exist substantially in the part just below the gate electrode 20 at a non-operating time (thermal equilibrium state) without using complicated circuits such as a cascode circuit or modified cascode circuit using low voltage resistance normally-off mode Si MOS transistors because the FET has the layer structure of the undoped GaN layer 11, the $Al_xGa_{1-x}N$ layer 12, the undoped GaN layer 13, the p-type GaN layer 14 and the p-type $In_yGa_{1-y}N$ layer 15 and further the gate electrode 16 on the p-type $In_yGa_{1-y}N$ layer 15 and the gate electrode 20 provided on the p-type $In_zGa_{1-z}N$ layer 19 on the $Al_xGa_{1-x}N$ layer 12 via the gate insulating film 23 and $n_0 \leq n_1 < n_2 < n_3$ and $p_1 > p_2$ are satisfied with respect to the concentration of the 2DEG 22 and the concentration of the 2DHG 21. In addition, in the normally-off mode polarization super junction GaN-based FET, the MIS structure is formed by the gate electrode 20, the gate insulating film 23 and the p-type $In_zGa_{1-z}N$ layer 19. Therefore, when a gate voltage not less than +3 V, for example, is applied to the gate electrode 20 to turn on the normally-off mode polarization super junction GaN-based FET from the off-state, it is possible to greatly reduce the gate current flowing through the channel. As a result, it is possible to save energy. Furthermore, the normally-off mode polarization super junction GaN-based FET can be used as transistors having various characteristics by choosing connecting way of each terminal or as diodes.

The Fourth Embodiment

[The Normally-Off Mode Polarization Super Junction GaN-Based FET]

Figure 22:
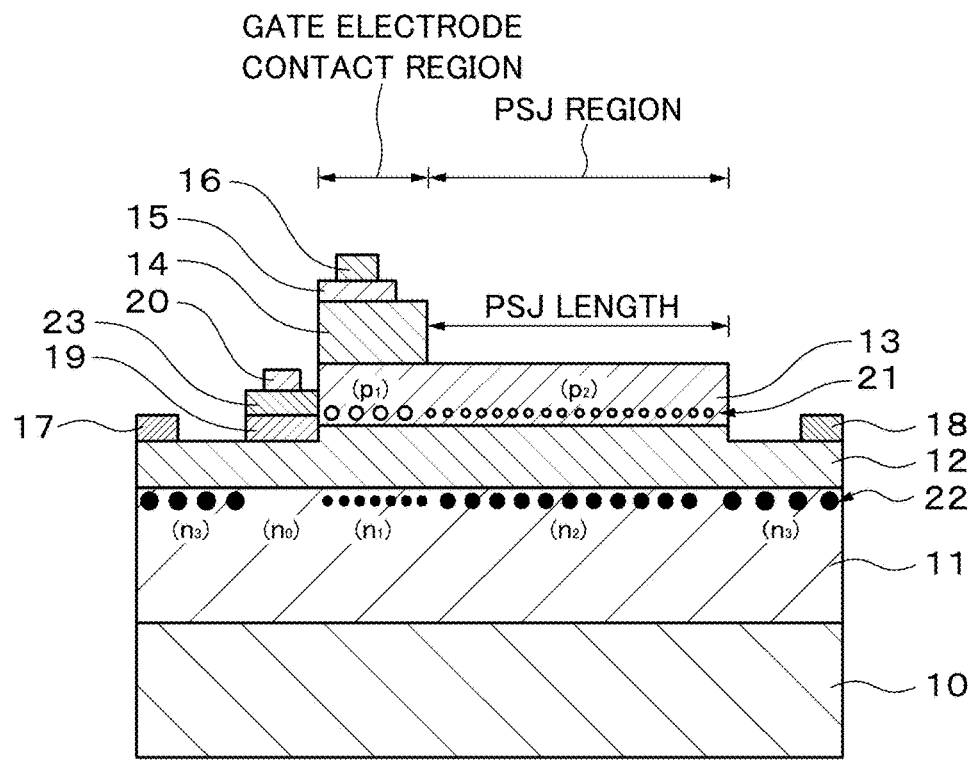
FIG. 22 A cross-sectional view showing a normally-off mode polarization super junction GaN-based FET according to a fourth embodiment of the invention.

As shown in FIG. 22, the normally-off mode polarization super junction GaN-based FET according to the fourth embodiment is different from the normally-off mode polarization super junction GaN-based FET according to the third embodiment in that the p-type GaN layer 14 does not exist in the polarization super junction region as the same as patent literature 1. Other than the above is the same as the normally-off mode polarization super junction GaN-based FET according to the third embodiment.

[Method for Manufacturing the Normally-Off Mode Polarization Super Junction GaN-Based FET]

The method for manufacturing the normally-off mode polarization super junction GaN-based FET is the same as the method for manufacturing the normally-off mode polarization super junction GaN-based FET according to the third embodiment except that the p-type GaN layer 14 is not finally formed on the undoped GaN layer 13 in the polarization super junction region.

According to the fourth embodiment, the same advantage as the third embodiment can be obtained.

The Fifth Embodiment

[The Normally-Off Mode Polarization Super Junction GaN-Based FET]

Figure 23:
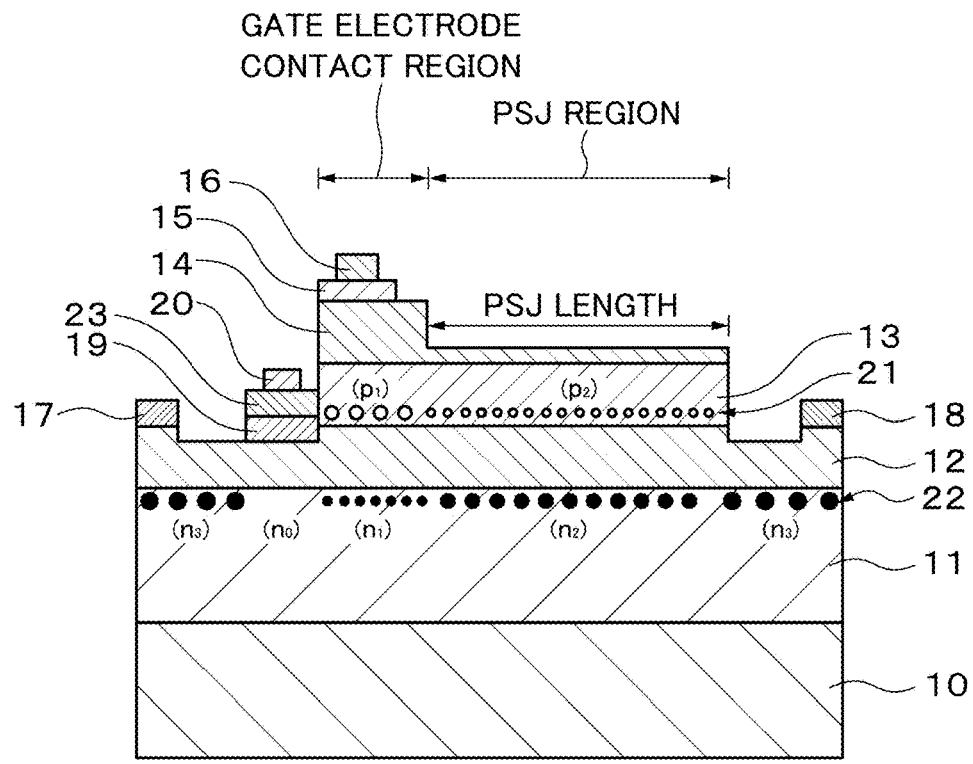
FIG. 23 A cross-sectional view showing a normally-off mode polarization super junction GaN-based FET according to a fifth embodiment of the invention.

As shown in FIG. 23, the normally-off mode polarization super junction GaN-based FET according to the fifth embodiment is different from the normally-off mode polarization super junction GaN-based FET according to the third embodiment in that the thickness of the parts of the $Al_xGa_{1-x}N$ layer 12 on which the source electrode 17 and the drain electrode 18 are provided is the same as or almost the same as the thickness of the part of the $Al_xGa_{1-x}N$ layer 12 on which the undoped GaN layer 13 is provided. Other than the above is the same as the normally-off mode polarization super junction GaN-based FET according to the third embodiment.

[Method for Manufacturing the Normally-Off Mode Polarization Super Junction GaN-Based FET]

According to the method for manufacturing the normally-off mode polarization super junction GaN-based FET, the p-type GaN layer 14 is etched to the depth midway in its thickness direction to thin it and an $Al_xGa_{1-x}N$ layer having the predetermined thickness is epitaxially grown by using the MOCVD method and the like before the p-type $In_yGa_{1-y}N$ layer 15 is epitaxially grown. Thereafter, the $Al_xGa_{1-x}N$ layer is patterned to remain it only on the parts of the $Al_xGa_{1-x}N$ layer 12 on which the source electrode 17 and the drain electrode 18 are to be formed. Other than the above is the same as the method for manufacturing the normally-off mode polarization super junction GaN-based FET according to the third embodiment. This patterning can be carried out by etching by, for example, the RIE method and the like. The thickness of the $Al_xGa_{1-x}N$ layer is the same as or almost the same as the value which is obtained by subtracting the thickness of the parts of the $Al_xGa_{1-x}N$ layer 12 on which the source electrode 17 and the drain electrode 18 are to be formed from the thickness of the part of the $Al_xGa_{1-x}N$ layer 12 below the undoped GaN layer 13. With this, the source electrode 17 and the drain electrode 18 can be formed on the $Al_xGa_{1-x}N$ layer 12 having the same thickness as the thickness of the part of the $Al_xGa_{1-x}N$ layer 12 below the undoped GaN layer 13.

According to the fifth embodiment, the same advantage as the third embodiment can be obtained.

Heretofore, embodiments and examples of the present invention have been explained specifically. However, the present invention is not limited to these embodiments and examples, but contemplates various changes and modifications based on the technical idea of the present invention.

For example, numerical numbers, structures, shapes, materials and the like presented in the aforementioned embodiments and examples are only examples, and the different numerical numbers, structures, shapes, materials and the like may be used as needed.

EXPLANATION OF REFERENCE NUMERALS

10 Substrate
11 Undoped GaN layer
12 $Al_xGa_{1-x}N$ layer
13 Undoped GaN layer
14 p-type GaN layer
15 p-type $In_yGa_{1-y}N$ layer
16 Gate electrode
17 Source electrode
18 Drain electrode
19 p-type $In_zGa_{1-z}N$ layer
20 Gate electrode
21 2DHG
22 2DEG
23 Gate insulating film

The invention claimed is:

1. A normally-off mode polarization super junction GaN-based field effect transistor, comprising:
a first undoped GaN layer,
an $Al_xGa_{1-x}N$ layer (0<x<1) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer (0<y<1) on the p-type GaN layer,
a source electrode on the $Al_xGa_{1-x}N$ layer,
a drain electrode on the $Al_xGa_{1-x}N$ layer,
a first gate electrode electrically connected to the p-type $In_yGa_{1-y}N$ layer; and
a p-type $In_zGa_{1-z}N$ layer (0<z<1) and a second gate electrode thereon on the $Al_xGa_{1-x}N$ layer which are located beside one end of the second undoped GaN layer on the side of the source electrode,
the $Al_xGa_{1-x}N$ layer having a protrusion having an island-like shape as the same as the second undoped GaN layer on an upper part just below the second undoped GaN layer, the p-type $In_zGa_{1-z}N$ layer and the second gate electrode being provided on a flat upper surface of a part of the $Al_xGa_{1-x}N$ layer which is located beside the protrusion, the first gate electrode and the second gate electrode being provided independently each other, the p-type GaN layer existing on the whole surface of the second undoped GaN layer or on only one side of the surface of the second undoped GaN layer on the side of the source electrode, the p-type $In_yGa_{1-y}N$ layer existing on only one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode, $n_0 \leq n_1 < n_2 < n_3$ and $n_0 < (1/1000) \times n_3$ being satisfied at a non-operating time if the concentration of a two-dimensional electron gas formed in the first undoped GaN layer in the vicinity part of a hetero-interface between the first undoped GaN layer and the $Al_xGa_{1-x}N$ layer just below the second gate electrode is denoted as $n_0$, the concentration of the two-dimensional electron gas just below the first gate electrode is denoted as $n_1$, the concentration of the two-dimensional electron gas in a polarization super junction region is denoted as $n_2$ and the concentration of the two-dimensional electron gas in a part between the polarization super junction region and the drain electrode is denoted as $n_3$, $p_1 > p_2$ being satisfied if the concentration of a two-dimensional hole gas formed in the second undoped GaN layer in the vicinity part of a hetero-interface between the second undoped GaN layer and the $Al_xGa_{1-x}N$ layer just below the first gate electrode is denoted as $p_1$ and the concentration of the two-dimensional hole gas in the polarization super junction region is denoted as $p_2$.

2. The normally-off mode polarization super junction GaN-based field effect transistor according to claim 1 wherein the In composition y and the thickness t of the p-type $In_yGa_{1-y}N$ layer are selected to satisfy $y \times t \leq 0.20 \times 5$ [nm] and the In composition z and the thickness t of the p-type $In_zGa_{1-z}N$ layer are selected to satisfy $z \times t \leq 0.20 \times 5$ [nm].

3. The normally-off mode polarization super junction GaN-based field effect transistor according to claim 1 wherein the first gate electrode and the second gate electrode are electrically connected each other and act as one gate electrode.

4. The normally-off mode polarization super junction GaN-based field effect transistor according to claim 1 wherein the first gate electrode and the source electrode are electrically connected each other and the first gate electrode acts as a field plate.

5. The normally-off mode polarization super junction GaN-based field effect transistor according to claim 4 wherein the first gate electrode is fixed to a positive potential with respect to the potential of the source electrode.

6. The normally-off mode polarization super junction GaN-based field effect transistor according to claim 1 wherein the first gate electrode, the second gate electrode and the source electrode are electrically connected each other and the transistor operates as a diode.

7. The normally-off mode polarization super junction GaN-based field effect transistor according to claim 1 wherein the second gate electrode is provided on the p-type $In_zGa_{1-z}N$ layer via a gate insulating film.

8. Electrical equipment, comprising:
at least a transistor,
the transistor being
a normally-off mode polarization super junction GaN-based field effect transistor, comprising:
a first undoped GaN layer,
an $Al_xGa_{1-x}N$ layer ($0<x<1$) on the first undoped GaN layer,
a second undoped GaN layer having an island-like shape on the $Al_xGa_{1-x}N$ layer,
a p-type GaN layer on the second undoped GaN layer,
a p-type $In_yGa_{1-y}N$ layer ($0<y<1$) on the p-type GaN layer,
a source electrode on the $Al_xGa_{1-x}N$ layer,
a drain electrode on the $Al_xGa_{1-x}N$ layer,
a first gate electrode electrically connected to the p-type $In_yGa_{1-y}N$ layer; and
a p-type $In_zGa_{1-z}N$ layer ($0<z<1$) and a second gate electrode thereon on the $Al_xGa_{1-x}N$ layer which are located beside one end of the second undoped GaN layer on the side of the source electrode,
the $Al_xGa_{1-x}N$ layer having a protrusion having an island-like shape as the same as the second undoped GaN layer on an upper part just below the second undoped GaN layer, the p-type $In_zGa_{1-z}N$ layer and the second gate electrode being provided on a flat upper surface of a part of the $Al_xGa_{1-x}N$ layer which is located beside the protrusion,
the first gate electrode and the second gate electrode being provided independently each other,
the p-type GaN layer existing on the whole surface of the second undoped GaN layer or on only one side of the surface of the second undoped GaN layer on the side of the source electrode,
the p-type $In_yGa_{1-y}N$ layer existing on one side of the surface of the p-type GaN layer on the side of the source electrode if the p-type GaN layer exists on the whole surface of the second undoped GaN layer or existing on the whole surface or a part of the surface of the p-type GaN layer if the p-type GaN layer exists on only one side of the surface of the second undoped GaN layer on the side of the source electrode,
$n_0 \leq n_1 < n_2 < n_3$ and $n_0 < (1/1000) \times n_3$
being satisfied at a non-operating time if the concentration of a two-dimensional electron gas formed in the first undoped GaN layer in the vicinity part of a hetero-interface between the first undoped GaN layer and the $Al_xGa_{1-x}N$ layer just below the second gate electrode is denoted as $n_0$, the concentration of the two-dimensional electron gas just below the first gate electrode is denoted as $n_1$, the concentration of the two-dimensional electron gas in a polarization super junction region is denoted as $n_2$ and the concentration of the two-dimensional electron gas in a part between the polarization super junction region and the drain electrode is denoted as $n_3$,
$p_1 > p_2$
being satisfied if the concentration of a two-dimensional hole gas formed in the second undoped GaN layer in the vicinity part of a hetero-interface between the second undoped GaN layer and the $Al_xGa_{1-x}N$ layer just below the first gate electrode is denoted as $p_1$ and the concentration of the two-dimensional hole gas in the polarization super junction region is denoted as $p_2$.

9. The electrical equipment according to claim 8 wherein the second gate electrode of the normally-off mode polarization super junction GaN-based field effect transistor is provided on the p-type In$_z$Ga$_{1-z}$N layer via a gate insulating film.

* * * * *